United States Patent
Kuzuhara et al.

(10) Patent No.: US 7,642,653 B2
(45) Date of Patent: Jan. 5, 2010

(54) SEMICONDUCTOR DEVICE, WIRING OF SEMICONDUCTOR DEVICE, AND METHOD OF FORMING WIRING

(75) Inventors: Takeshi Kuzuhara, Nukata-gun (JP); Atsushi Komura, Kariya (JP); Mitsutaka Katada, Hoi-gun (JP); Takayoshi Naruse, Okazaki (JP)

(73) Assignee: DENSO CORPORATION, Kariya (JP)

( * ) Notice: Subject to any disclaimer, the term of this patent is extended or adjusted under 35 U.S.C. 154(b) by 161 days.

(21) Appl. No.: 11/976,308

(22) Filed: Oct. 23, 2007

(65) Prior Publication Data

US 2008/0105947 A1 May 8, 2008

(30) Foreign Application Priority Data

| Oct. 24, 2006 | (JP) | ............................. | 2006-288711 |
| Oct. 24, 2006 | (JP) | ............................. | 2006-288715 |
| Oct. 25, 2006 | (JP) | ............................. | 2006-289982 |
| Jun. 6, 2007 | (JP) | ............................. | 2007-150431 |

(51) Int. Cl.
*H01L 23/52* (2006.01)
*H01L 23/48* (2006.01)
*H01L 29/40* (2006.01)
*H01L 29/00* (2006.01)
*H01L 21/4763* (2006.01)

(52) U.S. Cl. ........................ 257/758; 257/774; 257/506; 438/622

(58) Field of Classification Search ................. 257/758, 257/774, 506; 438/622
See application file for complete search history.

(56) References Cited

U.S. PATENT DOCUMENTS

| 5,502,337 | A | 3/1996 | Nozaki |
| 6,181,012 | B1 | 1/2001 | Edelstein et al. |
| 6,255,217 | B1 | 7/2001 | Agnello et al. |
| 6,261,939 | B1 | 7/2001 | Skala et al. |
| 6,261,951 | B1 | 7/2001 | Buchwalter et al. |
| 6,399,496 | B1 | 6/2002 | Edelstein et al. |
| 6,417,087 | B1 | 7/2002 | Chittipeddi et al. |
| 6,559,548 | B1 * | 5/2003 | Matsunaga et al. .......... 257/774 |

(Continued)

FOREIGN PATENT DOCUMENTS

JP          A-8-236706          9/1996

(Continued)

OTHER PUBLICATIONS

Office Action dated Nov. 7, 2008 in corresponding Chinese patent application No. 200710166889.0 (and English translation).

(Continued)

*Primary Examiner*—Luan C Thai
(74) *Attorney, Agent, or Firm*—Posz Law Group, PLC

(57) ABSTRACT

A semiconductor device includes a substrate, an element formed in the substrate, an insulation film formed on the substrate, wiring layers, and an electrode pad. The wiring layers are multilayered and electrically coupled to the element through the insulation film. The electrode pad is electrically coupled to a top wiring layer of the wiring layers. The top wiring layer is configured to be a top wiring-electrode layer that doubles as an electrode layer disposed under the electrode pad. The electrode layer of the top wiring-electrode layer is disposed directly above the element. The electrode pad and the electrode layer are multilayered to form a pad structure.

22 Claims, 15 Drawing Sheets

U.S. PATENT DOCUMENTS

| | | |
|---|---|---|
| 6,593,660 B2 | 7/2003 | Buchwalter et al. |
| 6,787,908 B2 | 9/2004 | Skala et al. |
| 6,838,769 B1 | 1/2005 | Chittipeddi et al. |
| 2004/0150070 A1 | 8/2004 | Okada et al. |
| 2005/0258484 A1 | 11/2005 | Itou |

FOREIGN PATENT DOCUMENTS

| | | |
|---|---|---|
| JP | B2-3481812 | 8/1998 |
| JP | B2-3403058 | 10/1999 |
| JP | A-2004-235586 | 8/2004 |
| JP | A-2005-223123 | 8/2005 |
| JP | A-2005-268374 | 9/2005 |
| JP | A-2007-103656 | 4/2007 |

OTHER PUBLICATIONS

Office Action dated Apr. 21, 2009 from German Patent Office in corresponding DE patent application No. 102007050610.6-33 (and English Translation).

Office Action dated Apr. 24, 2009 from Chinese Patent Office in corresponding CN patent application No. 2007101668890 (and English Translation).

* cited by examiner

FIG. 12
RELATED ART

|  | YOUNG'S MODULUS (kg/mm$^2$) |
|---|---|
| Al | $7.19 \times 10^3$ |
| Cu | $1.25 \times 10^4$ |
| Au | $8.02 \times 10^3$ |
| Ti | $1.12 \times 10^4$ |
| W | $3.98 \times 10^4$ |
| Ni | $2.14 \times 10^4$ |
| Cr | $2.55 \times 10^4$ |
| Ag | $8.43 \times 10^3$ |
| Pb | $1.64 \times 10^3$ |
| Pd | $1.21 \times 10^4$ |
| Pt | $1.68 \times 10^4$ |
| Mn | $1.27 \times 10^4$ |
| Zn | $1.11 \times 10^4$ |
| Sn | $5.09 \times 10^3$ |
| Si | $1.33 \times 10^4$ |
| PolySi | $1.72 \times 10^4$ |
| SiO2 | $7.78 \times 10^3$ |
| SiN | $2.40 \times 10^4$ |

SEMICONDUCTOR DEVICE, WIRING OF SEMICONDUCTOR DEVICE, AND METHOD OF FORMING WIRING

CROSS CHECK TO RELATED APPLICATION

This application is based on and incorporates herein by reference Japanese Patent Applications No. 2006-288711 filed on Oct. 24, 2006, No. 2006-288715 filed on Oct. 24, 2006, No. 2006-289982 filed on Oct. 25, 2006, and No. 2007-150431 filed on Jun. 6, 2007.

FIELD OF THE INVENTION

The present invention relates to a semiconductor device, wiring of the semiconductor device, and a method of forming the wiring.

BACKGROUND OF THE INVENTION

Wire bonding techniques have been proposed that allow wire bonding on an electrode pad of a semiconductor device in a case where a semiconductor element is formed below the electrode pad. In U.S. Pat. No. 6,261,939 corresponding to JP-A-2003-518739, thicknesses of an interlayer dielectric layer and a wiring layer positioned below the electrode pad is increased to between 1 micrometer ($\mu$m) and 2 $\mu$m. In JP-A-H8-236706, a wiring layer is multilayered below the electrode pad. Thus, a crack in the layer and a break in the semiconductor element are prevented. In U.S. Pat. No. 5,502,337 corresponding to JP-3432284, a via hole is formed around an electrode pad and not formed below the electrode pad. In US 2005/0258484A1 corresponding to JP-A-2006-5325, a copper (Cu) electrode pad is exposed to an insulation film or a passivation film, and a surface of the copper electrode pad is coated with an aluminum (Al) film. Thus, the copper electrode pad has a large thickness. While protecting the copper electrode pad from corrosion damage, the aluminum film helps reduce a bonding impact force transmitted to lower layers.

However, in the structures of U.S. Pat. No. 6,261,939 and JP-A-H8-236706, it depends on patterns of the layers, whether the crack in the layer and the break in the semiconductor element can be prevented, or not. It has been confirmed that the crack in the layers and the break in the semiconductor element cannot always be prevented. In the structure of U.S. Pat. No. 5,502,337, since the via hole is formed around the electrode pad, drain and source wiring of a power element (i.e., a semiconductor switching element) must be extended accordingly. As a result, an effective length of the wiring is increased, and a wiring resistance and a parasitic inductance of the wiring are increased accordingly. In particular, it is likely that the wiring resistance of the wiring become large, because the wiring become very thin at the lowest layer.

In the structure of US 2005/0258484A1, addition processes are required to form the copper electrode pad coated with the aluminum film. As a result, manufacturing step and cost are increased accordingly. Further, since the copper electrode pad narrows toward its top, a top portion of the copper electrode pad vibrates during wire bonding. Therefore, adhesion of the copper electrode to the semiconductor device is reduced due to the vibration. The vibration may cause cracks in the interlayer dielectric film. Furthermore, the aluminum film on the copper electrode pad is plastically deformed during the wire bonding and pushed off the top portion of the copper electrode pad. As a result, the aluminum film is thinned and cannot suitably reduce the bonding impact force.

One approach to reduce transmission of a bonding impact force to a lower layer is to increase thickness of an upper wiring layer. Lately, multilayered wiring of a semiconductor device is typically formed by a dual-damascene process. In the dual-damascene process, as disclosed, for example, in JP-3403058, a wiring trench and a via trench are formed in an insulation film formed on a semiconductor substrate. A wiring material such as copper (Cu) is filled in the wiring trench and the via trench so an upper wiring layer is connected to a lower wiring layer through a via. Thus, the upper wiring layer and the via are formed in the same step so that time required to form the wiring can be reduced.

FIGS. 21A-21C illustrate a conventional method of forming wiring of a semiconductor device. First, as shown in FIG. 21A, an insulation film 212 is formed on a semiconductor substrate 210 on which a lower wiring layer 211 is formed. Then, a first resist pattern for a via trench 213 is formed by a photolithography process. Then, the insulation film 212 is etched to a predetermined depth by using the resist pattern as a mask. Thus, the via trench 213 is formed.

Then, as shown in FIG. 21B, the insulation film 212 is etched by using a second resist pattern as a mask, until the lower wiring layer 211 is exposed. The second resist pattern is shaped corresponding to the first resist pattern and has a width greater than that of the first resist pattern. Thus, a wiring resist 215 is formed, and the via trench 213 reaches the lower wiring layer 211.

Then, as shown in FIG. 21C, a barrier layer 216 and a seed layer 217 are formed in the via trench 213 and the wiring trench 215. Then, a wiring material is filled in the via trench 213 and the wiring trench 215. The barrier and seed layers 216, 217 prevent the wiring material from diffusing into the insulation film 212. After filling, the excess wiring material is removed by, for example, a chemical mechanical polishing (CMP) process. Thus, a via 218 and an upper wiring layer 219 are formed. For example, the via 218 has a thickness of 1 $\mu$m, and the upper wiring layer 219 has a thickness of 1 $\mu$m.

In a combined integrated circuit (IC) including a complementary metal-oxide semiconductor (CMOS), a bipolar transistor, and a power element (i.e., semiconductor switching element), there has been a need to increase thickness of an upper wiring layer 219 to absorb a bonding impact force, to improve heat dissipation, or to withstand an increased current of the power element.

To increase the thickness of the upper wiring layer 219, thickness of an insulation film 212 needs to be increased accordingly. However, when the insulation film 212 having increased thickness is formed by using the conventional method illustrated in FIGS. 21A-21C, it is likely that the thickness of the insulation film 212 is nonuniform.

Further, since the amount of etching the insulation film 212 is increased accordingly, it is likely that the depth of the wiring trench 215 is nonuniform. Therefore, the insulation film 212 is over-etched to ensure that the via trench 213 reaches the lower wiring layer 211. If the insulation film 212 is over-etched excessively, the depth of the via trench 213 becomes very small so that the via 218 becomes very thin. As a result, the distance between the lower and upper wiring layers 211, 219 become very small so that a short-circuit may occur due to an increase in a leak current.

SUMMARY OF THE INVENTION

In view of the above-described problem, it is an object of the present invention to provide a semiconductor device, in which a bonding impact force is suitably absorbed to prevent a crack in a lower layer and a break in a semiconductor element located below a bonding portion of the semiconductor device.

A semiconductor device includes a semiconductor substrate, a semiconductor element, an interlayer dielectric film, a plurality of wiring layers, and an electrode pad. The semiconductor element is formed in the semiconductor substrate. The interlayer dielectric film is disposed on the semiconductor substrate. The plurality of wiring layers are multilayered and electrically coupled to the semiconductor element through the interlayer dielectric film. The electrode pad is electrically coupled to a top wiring layer of the plurality of wiring layers. The electrode pad is configured to be bonded to a metal member for electrically coupling the semiconductor element to an external device.

The top wiring layer is configured to be a top wiring-electrode layer that doubles as an electrode layer disposed under the electrode pad. The top wiring-electrode layer is formed with a first material having a first Young's Modulus value. The electrode pad is formed with a second material having a second Young's Modulus value less than the first Young's Modulus value. The electrode layer of the top wiring-electrode layer is disposed directly above the semiconductor element. The electrode pad and the electrode layer are multilayered to form a pad structure. The interlayer dielectric film includes an insulation film that surrounds the top wiring-electrode layer to cover sidewalls of the top wiring-electrode layer.

Another object of the present invention is to provide wiring of the semiconductor device.

Yet another object of the present invention is to provide a method of forming the wiring of the semiconductor device.

BRIEF DESCRIPTION OF THE DRAWINGS

The above and other objectives, features and advantages of the present invention will become more apparent from the following detailed description made with check to the accompanying drawings. In the drawings:

FIG. 12 is a table showing relationships between materials and Young's Modulus values;

DETAILED DESCRIPTION OF THE PREFERRED EMBODIMENTS

First Embodiment

Figure 1:
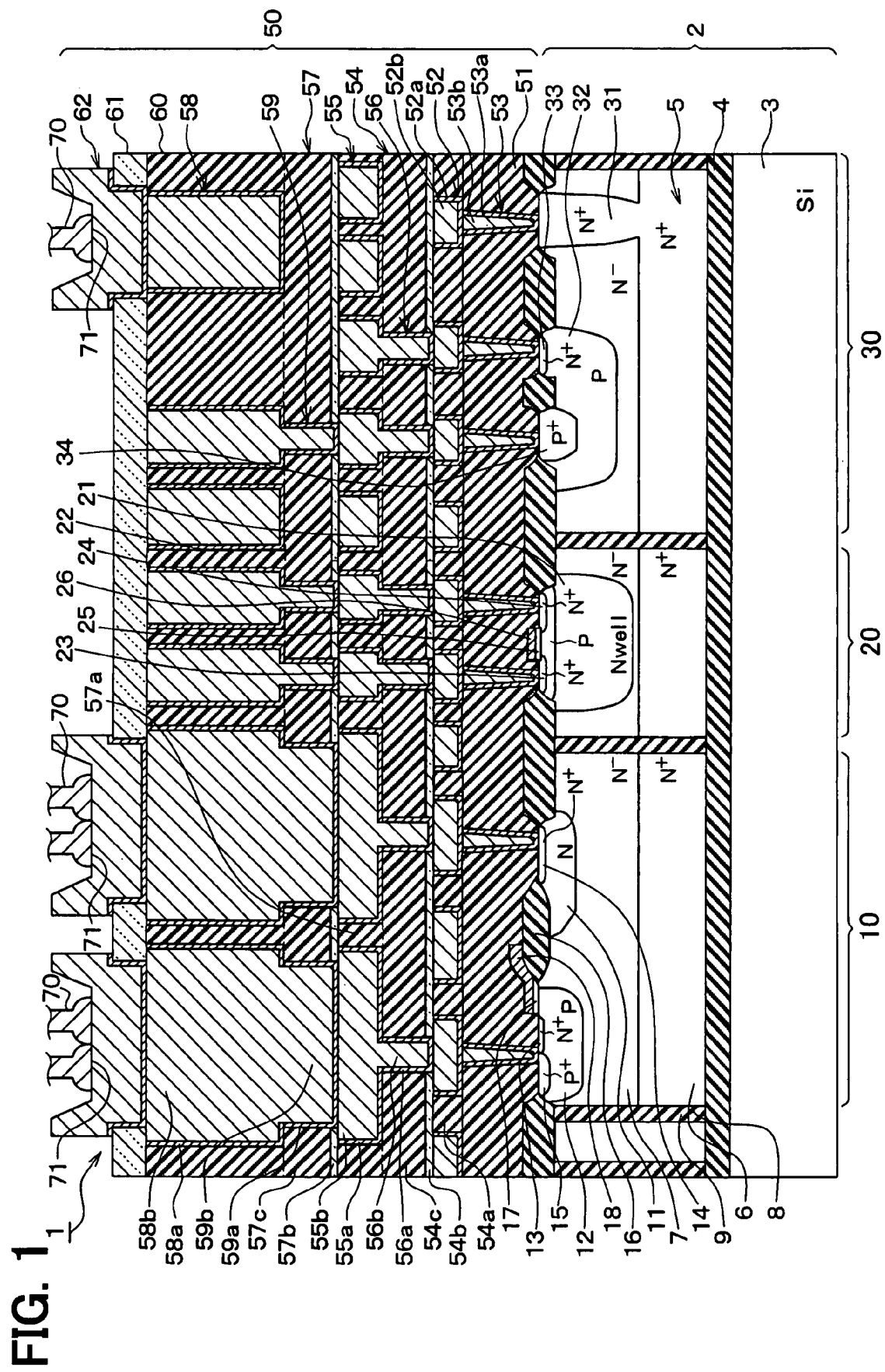
FIG. 1 is a cross-sectional view of a semiconductor device according to a first embodiment of the present invention.

Referring to FIG. 1, a semiconductor device 1 according to a first embodiment of the present invention includes a laterally diffused metal oxide semiconductor (LDMOS) 10, a complementary metal-oxide-semiconductor (CMOS) 20, and a bipolar transistor 30, which are integrated together to form an integrated circuit. The semiconductor device 1 is formed by using a silicon on insulator (SOI) substrate 2.

The SOI substrate 2 has a structure such that a silicon layer 5 as an active layer is disposed on a surface of a silicon substrate 3 through an insulator layer 4. The silicon substrate 3 acts as a supporting substrate, and the insulator layer 4 is a silicon oxide film, for example. The silicon layer 5 includes a N+ type layer 6 and a N− type 7 formed to a surface portion of the N+ type layer 6. The LDMOS 10, the CMOS 20, and the bipolar transistor 30 are formed in first, second, and third regions of the silicon layer 5. The first, second, and third regions are separated from each other by a trench 8 filled with an insulation film 9. Thus, the LDMOS 10, the CMOS 20, and the bipolar transistor 30 are electrically isolated from each other.

The LDMOS 10 includes a N type drain region 11, a P type channel region 12, and a N+ type source region 13, which are disposed to a surface portion of the N− type layer 7 of the silicon layer 5. A N+ contact layer 14 is formed to a surface portion of the N type drain region 11. A P type contact layer 15 is formed to a surface portion of the P type channel region 12. The N type drain region 11 and the P type channel region 12 are electrically isolated from each other by a local oxidation of silicon (LOCOS) oxide film 16. A gate electrode 18 is disposed on the P type channel region 12 through a gate insulation film 17.

The CMOS 20 includes a N type well layer 21 formed in the N− type layer 7, a P type layer 22 formed to a surface portion of the N type well layer 21, a N+ type source region 23 formed to a surface portion of the P type layer 22, and a N+ type drain region 24 formed to the surface portion of the P type layer 22. A gate electrode 26 is disposed on the P type layer 22 through a gate insulation film 25 between the N+ type source region 23 and the N+ type drain region 24. Although FIG. 1 shows only a N channel MOSFET of the CMOS 20, a P channel MOSFET of the CMOS 20 is formed as well.

The bipolar transistor 30 includes a N+ type collector region 31, a P type base region 32, a N+ type emitter layer 33, and a P+ type contact layer 34. The N+ type collector region 31 penetrates through the N− type layer 7 and is connected to the N+ type layer 6. The P type base region 32 is formed to a surface portion of the N− type layer 7. Each of the N+ type emitter layer 33 and the P+ type contact layer 34 is formed to a surface portion of the P type base region 32.

A wiring structure 50 is formed on a surface of the SOI substrate 2, where each element is formed as described above. The wiring structure 50 includes a borophosphosilicate glass (BSPG) film 51, a first wiring layer 52, a first contact portion 53 disposed in a contact hole of the BSPG film 51, a first insulation film 54, a second wiring layer 55, a second contact portion 56 disposed in a via hole of the first insulation film 54, a second insulation film 57, a top wiring-electrode layer 58, a third contact portion 59 disposed in a via hole of the second insulation film 57, a third insulation film 60, a P—SiN film 61 as a passivation film, and a bonding pad 62, which are formed on the silicon layer 5 of the SOI in the mentioned order. The bonding pad 62 is electrically connected to the top wiring-electrode layer 58 through an opening formed to the P—SiN film 61. A bonding wire 70 is electrically connected to the bonding pad 62 of the wiring structure 50.

The first and second wiring layers 52, 55 serve as a power line, a ground line, an a connection line for each element including the LDMOS 10, the CMOS 20, and the bipolar transistor 30.

The first contact portion 53 includes a barrier metal 53a and a tungsten (W) plug 53b disposed on the barrier metal 53a. For example, the barrier metal 53a is formed with a laminated film of titanium and titanium nitride (Ti/TiN), or tantalum and tantalum nitride (Ta/TaN). The first contact portion 53 is electrically connected to each of the LDMOS 10, the CMOS 20, and the bipolar transistor 30 through a contact hole formed to the BPSG film 51.

The first wiring layer 52 includes a barrier metal 52a and a copper (Cu) layer 52b disposed on the barrier metal 52a. The barrier metal 52a is formed with a laminated film of Ti/TiN or Ta/TaN. The second wiring layer 55 includes a barrier metal 55a and a Cu layer 55b disposed on the barrier metal 55a. The barrier metal 55a is formed with a laminated film of Ti/TiN or Ta/TaN.

The first wiring layer 52 is disposed in a wiring trench formed in a first tetraethylorthosilicate (TEOS) film 54a of the first insulation film 54. A silicon nitride film 54b and a second TEOS film 54c of the first insulation film 54 are formed to cover over the first wiring layer 52. The silicon nitride film 54b and the second TEOS film 54c have openings in predetermined locations through which the second contact portion 56 is electrically connected to the first wiring layer 52.

The second contact portion 56 includes a barrier metal 56a and a Cu layer 56b disposed on the barrier metal 56a. The barrier metal 56a is formed with a laminated film of Ti/TiN or Ta/TaN.

The second wiring layer 55 is disposed in a wiring trench formed in a first TEOS film 57a of the second insulation film 57. A silicon nitride film 57b and a second TEOS film 57c of the second insulation film 57 are formed to cover over the second wiring layer 55. The silicon nitride film 57b and the second TEOS film 57c have openings in predetermined locations through which the third contact portion 59 is electrically connected to the second wiring layer 55.

The third contact portion 59 includes a barrier metal 59a and a Cu layer 59b disposed on the barrier metal 59a. The barrier metal 59a is formed with a laminated film of Ti/TiN or Ta/TaN.

The top wiring-electrode layer 58 includes a barrier metal 58a and a Cu layer 58b disposed on the barrier metal 58a. The barrier metal 58a is formed with a laminated film of Ti/TiN or Ta/TaN. The top wiring-electrode layer 58 doubles as a wiring layer and an electrode layer of a top layer of each element including the LDMOS 10, the CMOS 20, and the bipolar transistor 30. The top wiring-electrode layer 58 is buried in the third insulation film 60 so that all side walls of the top wiring-electrode layer 58 are surrounded by the third insulation film 60. A top surface of the top wiring-electrode layer 58 and a top surface of the third insulation film 60 are arranged at approximately the same level. Therefore, the top surface of the top wiring-electrode layer 58 is substantially flat with respect to the top surface of the third insulation film 60. A thickness of the top wiring-electrode layer 58 is greater than that of each of the first wiring layer 52 and the second wiring layer 55.

As described above, the top wiring-electrode layer 58 doubles as the top wiring layer and the electrode layer. In such an approach, the top wiring layer can be constructed to have a large thickness so that a wiring resistance can reduced, as compared to the case where the top wiring layer and the electrode layer are separately constructed. Further, the top wiring layer and the electrode layer are formed in the same manufacturing process, so that manufacturing processes can be simplified.

A portion of the top wiring-electrode layer 58 is electrically coupled to a portion of the element. A large electric current flows through the portion of the element. The top wiring-electrode layer 58 has a larger area (i.e., volume) at the portion, when viewed from an upside of FIG. 1. Specifically, a portion of the top wiring-electrode layer 58 is electrically coupled to the N type drain region 11 and the N+ type source region 13 of the LDMOS 10. The top wiring-electrode layer 58 has a larger area at the portion, when viewed from the upside of FIG. 1.

The top wiring-electrode layer 58 also serves as a lower electrode layer that resides on the lower layer of the bonding pad 62. Therefore, the top wiring-electrode layer 58 is formed with material having a large Young's Modulus value greater than or equal to $1.0 \times 10^4$ kg/mm$^2$. In the present embodiment, the Cu layer 5% is used as a base material of the top wiring-electrode layer 58. Alternatively, the top wiring-electrode layer 58 can be formed with copper alloy, titanium (Ti), tungsten (W), nickel (Ni), chromium (Cr), palladium (Pd), platinum (Pt), manganese (Mn), zinc (Zn), doped silicon, doped polysilicon, or the like. However, workability, electric conductivity, and thermal conductivity of the top wiring-electrode layer 58 need to be taken into account, because the top wiring-electrode layer 58 doubles as the top wiring layer. Further, interdiffusion coefficient between the top wiring-electrode layer 58 and gold (Au) need to be taken into account, because a bonding wire 70 is formed with gold (Au). Specifically, when the interdiffusion coefficient between the top wiring-electrode layer 58 and gold (Au) is small, diffusion of gold of the bonding wire 70 can be prevented. Therefore it is preferable that the top wiring-electrode layer 58 be formed with copper (Cu) or copper alloy. In this case, microfabrication of wiring and a reduction in resistance of wiring can be achieved by using a copper (Cu) damascene process. Moreover, for example, a first interdiffusion coefficient between a first material (of the top wiring-electrode layer) 58) and a second material (of the bonding pad 62) can be less than a second interdiffusion coefficient between the second material (of the bonding pad 62) and a third material (of the bonding wire (70)

The top wiring-electrode layer 58 receives an impact force during wire bonding. The impact force is applied to the top wiring-electrode layer 58 in perpendicular and lateral directions. The top wiring-electrode layer 58 is buried and fixed in the third insulation film 60, which has hardness. The third insulation film 60 effectively prevents the top wiring-electrode layer 58 from being deformed by the impact force. For example, when the wire bonding is performed under a typical bonding condition, the deformation of the top wiring-electrode layer 58 can be suitably prevented by setting thickness of the top wiring-electrode layer 58 greater than or equal to 0.3 micrometers ($\mu m$), preferably 0.7 $\mu m$. In the typical bonding condition, the bonding wire 70 is formed with 4N_Au (i.e. 99.99% Au) or 1% Pd_Au, a diameter of the bonding wire 70 is between 30 $\mu m$ and 38 $\mu m$, bond force is between 25 gram and 125 gram, an ultra sonic power is between 75 and 255, and a temperature is 230 degrees Celsius.

The third insulation film 60 is formed with a TEOS film and disposed on the second insulation film 57 and the third contact portion 59. A thickness of the third insulation film 60 is equal to a thickness of the top wiring-electrode layer 58. The top wiring-electrode layer 58 is disposed in a trench formed in the third insulation film 60.

The P—SiN film 61 corresponds to a passivation film and may be, for example, formed with a chemical vapor deposition (CVD) film. The P—SiN film 61 covers the third insulation film 60 and the top wiring-electrode layer 58. The P—SiN film 61 has an opening where the bonding pad 62 is arranged. In stead of a P—SiN film, a film having moisture resistance and electrical insulation can be used as the passivation film.

The bonding pad 62 is electrically connected to the top wiring-electrode layer 58 through the opening formed in the P—SiN film 61. Each element including the LDMOS 10, the CMOS 20, and the bipolar transistor 30 is electrically connected to an external device by a wire bonding to the bonding pad 62.

The bonding pad 62 is formed with material having a Young's Modulus value to be plastically deformed by the impact force during the wire bonding. Specifically, the bonding pad 62 is formed with material having a Young's Modulus value less than that of the top wiring-electrode layer 58. For example, the bonding pad 62 is formed with material having a Young's Modulus value less than or equal to $8.0 \times 10^3$ kg/mm$^2$. In the present embodiment, the bonding pad 62 is formed with aluminum (Al). Alternatively, the bonding pad 62 can be formed with gold (Au), silver (Ag), lead (Pb), Tin (Sn), or the like.

The bonding pad 62 is plastically deformed to absorb the impact force during the wire bonding. The thickness of the bonding pad 62 is set, so that a bonding wire 70 is separated from the top wiring-electrode layer 58 by the bonding pad 62 after the bonding wire 70 is wire-bonded to the bonding pad 62. In short, the thickness of the bonding pad 62 is set, so that the bonding wire 70 does not penetrate through the bonding pad 62 during the wire bonding. In such an approach, the bonding pad 62 can absorb the impact force during the wire bonding. For example, in the typical bonding condition, when the thickness of the bonding pad 62 is greater than or equal to 0.5 $\mu m$, the bonding pad 62 can suitably absorb the impact force during the wire bonding. When the thickness of the bonding pad 62 is greater than or equal to 1 $\mu m$, the bonding pad 62 can surely absorb the impact force during the wire bonding.

In the present embodiment, a pad structure is formed with the bonding pad 62 and an electrode layer portion of the top wiring-electrode layer 58. If both the top wiring-electrode layer 58 and the bonding pad 62 are formed with material having a large Young's Modulus value, the impact force during the wire bonding is directly transmitted to the top wiring-electrode layer 58. As a result, an interlayer dielectric film is cracked, and an element is broken. In contrast, if both the top wiring-electrode layer 58 and the bonding pad 62 are formed with material having a small Young's Modulus value, both the top wiring-electrode layer 58 and the bonding pad 62 are plastically deformed by the impact force during the wire bonding. As a result, an interlayer dielectric film is cracked, and an element is broken. To prevent the crack in the interlayer dielectric film and the break in the element, the bonding pad 62 as the upper layer is formed with material having a small Young's Modulus value, and the top wiring-electrode layer 58 as the lower layer is formed with material having a large Young's Modulus value.

The top wiring-electrode layer 58 and the bonding pad 62 are formed directly above the cell portion, where each element including the LDMOS 10, the CMOS 20, and the bipolar transistor 30 are formed. Therefore, each element can be electrically connected to the top wiring-electrode layer 58 and the bonding pad 62 without extending the contact portions 53, 56, 59 and the wiring layers 57 to outside the cell portion. In such an approach, a wiring resistance and a parasitic inductance can be reduced. Further, the semiconductor device 1 can have high flexibility in designing the wiring pattern.

Figure 2A:
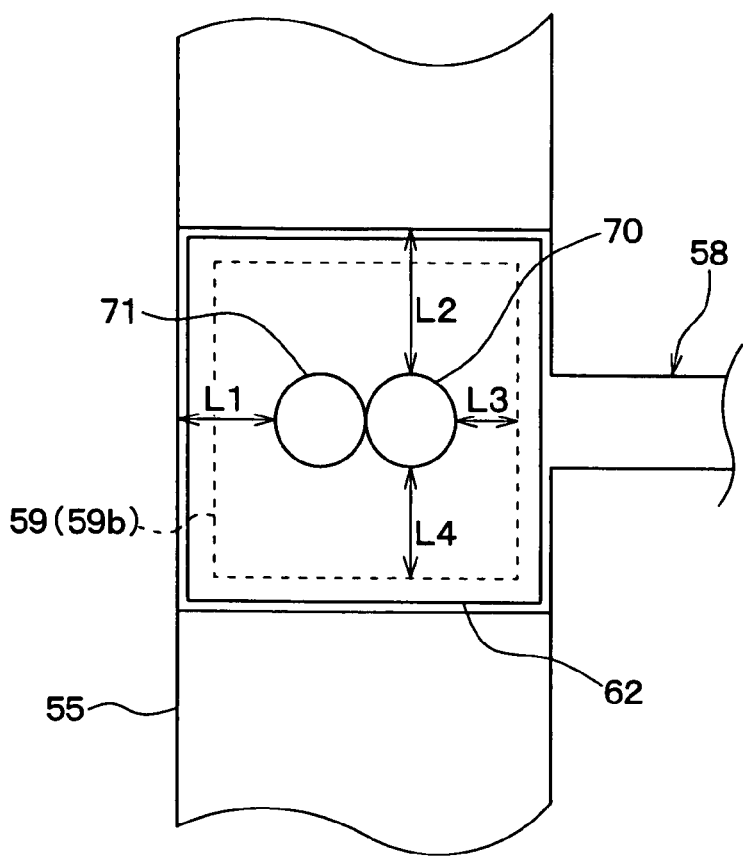
FIG. 2A is a top view showing a positional relationship between a bonding wire and a bonding pad of the semiconductor device of FIG. 1.
Figure 2B:
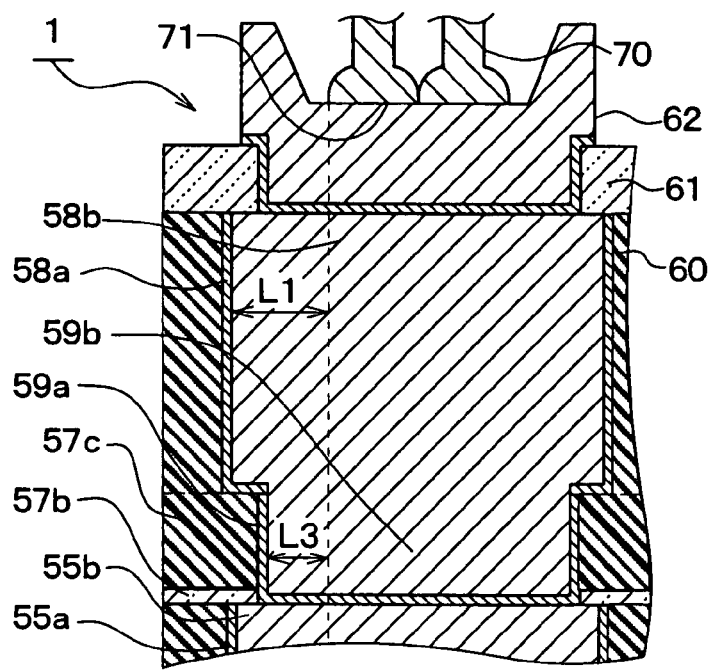
FIG. 2B is a cross-sectional view of FIG. 2A.

The bonding wire 70 may be, for example, formed with a gold (Au) wire. The bonding wire 70 is electrically connected to the bonding pad 62 by, for example, ultrasonic wire bonding. The bonding wire 70 has a bonding ball at its tip, and is wire-bonded to the bonding pad 62 at the bonding ball. FIGS. 2A, 2B illustrate positional relationships between the bonding ball of the bonding wire 70, and the top wiring-electrode layer 58 and the bonding pad 62. As shown in FIG. 2A, an outer edge of a contact surface 71, where the bonding ball and the bonding pad 62 are wire-bonded together, is separated from an outer edge of the Cu layer 58b by distances L1, L2 in the lateral directions. The outer edge of the contact surface 71 is separated from an outer edge of the Cu layer 59b by distances L3, L4 in the lateral directions. In the present embodiment, width of the top wiring-electrode layer 58 is set so that each of the distances L1, L2 is greater than or equal to 1 $\mu m$.

It is preferable that the width of the top wiring-electrode layer 58 be set so that each of the distances L3, L4 is greater than or equal to 1 μm.

In the semiconductor device 1 according to the present embodiment, the top wiring-electrode layer 58 is arranged directly above the cell portion, where the LDMOS 10 as a power element (i.e., power semiconductor switching element) is formed. The top wiring-electrode layer 58 doubles as the top wiring layer and the electrode layer. The top wiring layer is electrically connected to elements in the cell portion. The electrode layer constructs a portion of the pad structure.

Since the top wiring-electrode layer 58 doubles as the top wiring layer and the electrode layer, wiring resistance in the power element can be reduced. Further, the wiring layer of the top wiring-electrode layer 58 has a large volume so that heat can be efficiently dissipated. Furthermore, the transmission of the impact force during the wire bonding to the lower wiring layer is reduced so that the crack in the interlayer dielectric film and the break in the element can be prevented. Furthermore, since the wiring layer and the electrode layer of the top layer are formed in the same manufacturing process, the manufacturing processes can be simplified.

Thus, even when the wiring layer and the bonding pad 62 are electrically connected directly above the cell portion, the crack in the bonding pad 62 and the lower wiring layer and the break in the element can be prevented without additional manufacturing processes. Further, since the effective length of the wiring is reduced, the wiring resistance and the parasitic inductance in the semiconductor device 1 can be reduced.

Figure 3:
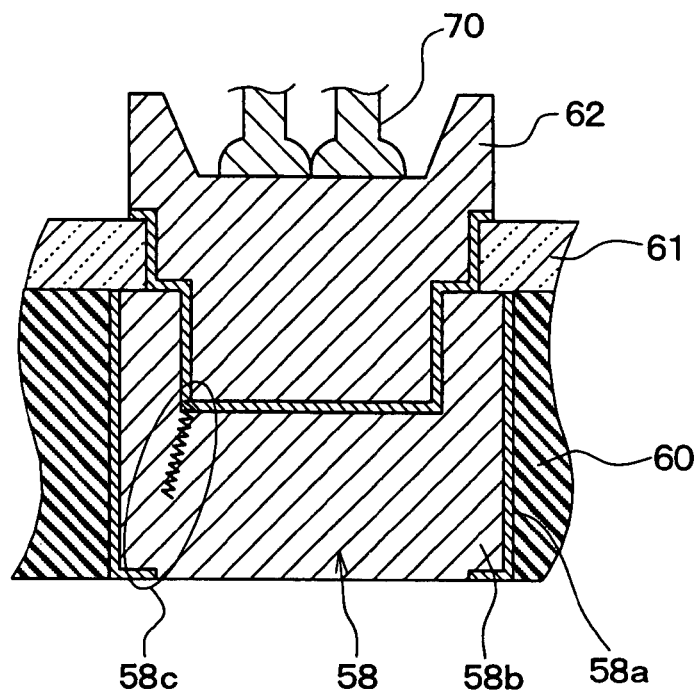
FIG. 3 is a cross-sectional view showing a bonding portion of the semiconductor device when a top wiring-electrode layer is formed by pattering techniques.

According to the present embodiment, the top surface of the top wiring-electrode layer 58 and the top surface of the third insulation film 60 are arranged at approximately the same level so that the substantially flat surface is formed by the top surfaces. When the top wiring-electrode layer 58 is formed by patterning techniques, the top wiring-electrode layer 58 may have a difference level portion as shown in FIG. 3. If the bonding pad 62 and the bonding wire 70 are placed on the difference level portion, intercrystalline crack occurs at a corner 58c of the difference level portion due to stress. As a result, an interdiffusion-layer of gold (Au) in the bonding wire 70 and aluminium (Al) in the bonding pad 62 enters the cracked corner 58c and propagates the lower wiring layer. In the present embodiment, the top surface of the top wiring-electrode layer 58 and the top surface of the third insulation film 60 are arranged at approximately the same level. In such an approach, barrier capability of the top wiring-electrode layer 58 can be ensured so that the top wiring-electrode layer 58 can prevent the interdiffusion-layer of gold (Au) and the aluminum (Al) from propagating the lower wiring layer.

Further, according to the present embodiment, since the sidewalls of the top wiring-electrode layer 58 are surrounded by the third insulation film 60, the top wiring-electrode layer 58 can be prevented from swaying during the wire bonding. Therefore, reduction in adhesion of the top wiring-electrode layer 58 to a base metal can be limited. Further, the crack in the interlayer dielectric film can be prevented. Furthermore, coatability reduction caused by a thinned bonding pad 62 can be limited.

Figure 4:
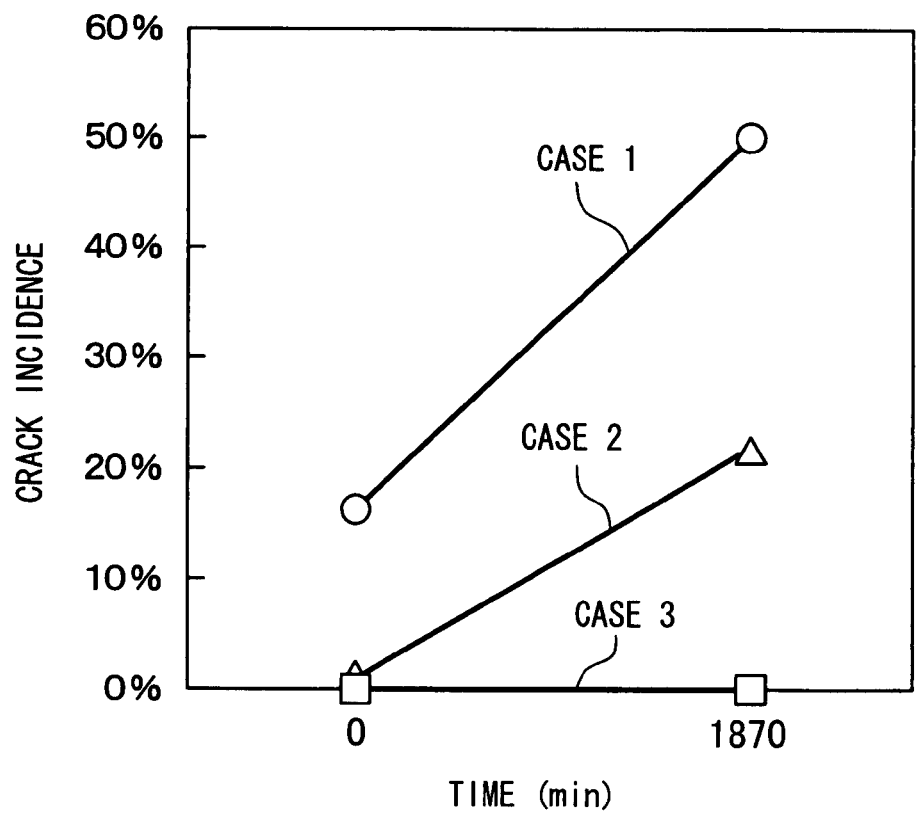
FIG. 4 is a diagram showing graphs of incidences of cracks in the semiconductor device when the top wiring-electrode layer is formed in various manners.

FIG. 4 shows graphs of incidences of cracks in a semiconductor device when the semiconductor device is left for 1870 minutes at a temperature of 250 degrees Celsius (° C.) after the semiconductor device is manufactured. A first graph CASE1 represents a case where the top wiring-electrode layer 58 is formed with aluminum (Al). A second graph CASE2 represents a case where a copper (Cu) layer with a thickness of 2 μm is grown by sputtering, and top wiring-electrode layer 58 is formed by etching the copper (Cu) layer in such a manner that the top wiring-electrode layer 58 has the different level portion. A third graph CASE3 represents a case where a copper (Cu) layer with a thickness of 2 μm is grown by plating, and the top wiring-electrode layer 58 is formed in such a manner that the top surface of the top wiring-electrode layer 58 is substantially flat, like the present embodiment. As can be seen from FIG. 4, the incidences of cracks can be reduced by making the top surface of the top wiring-electrode layer 58 substantially flat. Thus, the barrier capability of the top wiring-electrode layer 58 can be ensured even under high temperature conditions.

According to the present embodiment, the P—Sin film 61 as the passivation film covers the top wiring-electrode layer 58 except for a portion where the bonding pad 62 is arranged. In such an approach, the following effects are obtained.

Figure 5A:
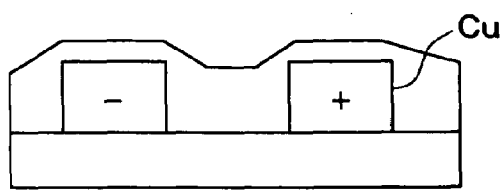
FIGS. 5A-5C are diagrammatic illustrations showing phenomena observed when a copper wiring is exposed to water.
Figure 5B:
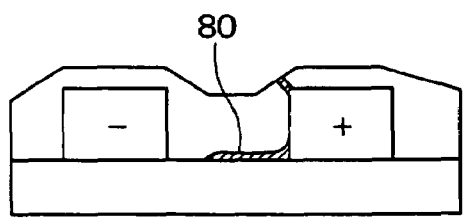
Figure 5C:
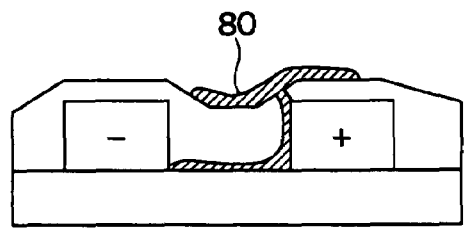

FIGS. 5A-5C are diagrammatic illustrations showing phenomena observed when a copper wiring is exposed to water. When the semiconductor device 1 is used under high temperature and high humidity conditions, copper (Cu) in the top wiring-electrode layer 58 is ionized so that the electrolysis of water can occur, as shown in FIG. 5A. As a result, the copper becomes an anode, and an adjacent wiring having a different potential becomes a cathode. Then, as shown in FIG. 5B, a reaction layer (i.e., dendrite) 80 is formed and grows from the anode to the cathode. As a result, as shown in FIG. 5C, the top wiring-electrode layer 58 is connected to the adjacent wiring so that a short circuit occurs. In contrast, according to the present embodiment, since the P—Sin film 61 as the passivation film covers the top wiring-electrode layer 58 except for the portion where the bonding pad 62 is arranged, the formation of the reaction layer 80 can be prevented. Further, oxidation of the surface of the top wiring-electrode layer 58 can be prevented, and polluted water from a factory can be prevented.

Figure 6:
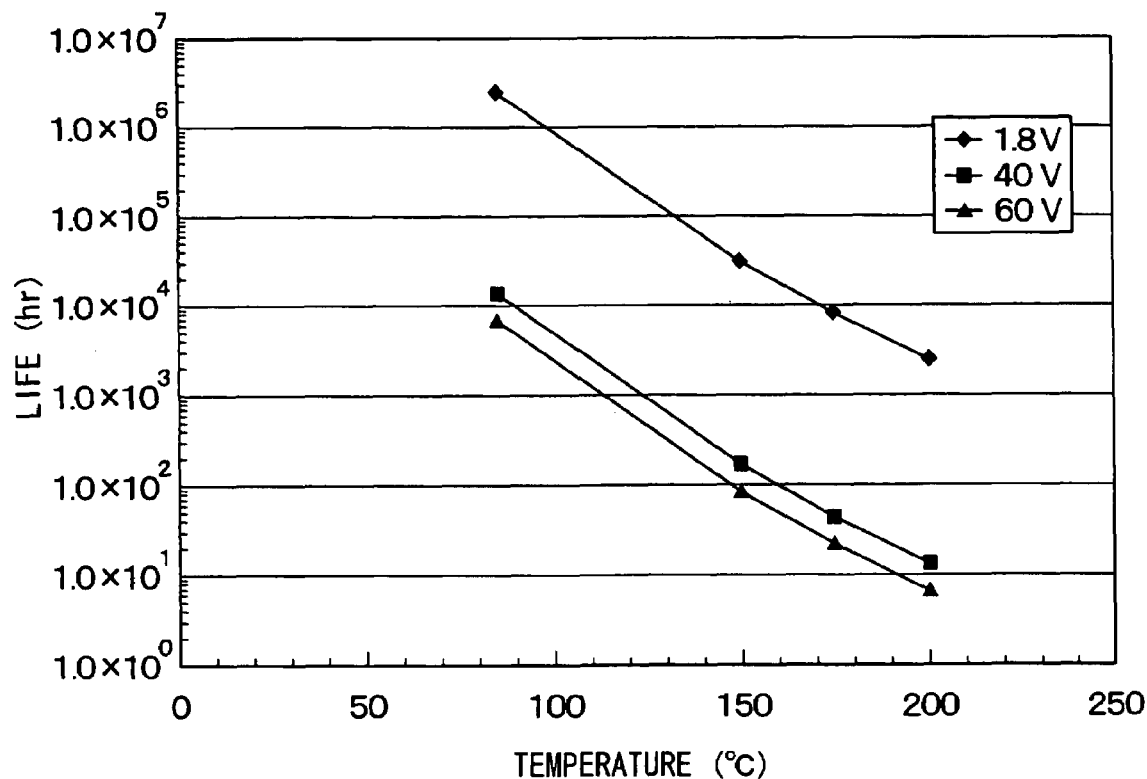
FIG. 6 is a diagram showing graphs of a relationship between a life, an operating temperature, and an operating voltage of the semiconductor device.

FIG. 6 shows a relationship between a life, an operating temperature, and an operating voltage of the semiconductor device 1, when the top wiring-electrode layer 58 is covered with the P—Sin film 61 as the passivation film. The life of the semiconductor device 1 is defined as a period of time during which the semiconductor device 1 functions normally. Specifically, the life of the semiconductor device 1 is defined as a period of time after which the reaction layer 80 grows up to 250 μm so that the top wiring-electrode layer 58 is short-circuited to the adjacent wiring by the reaction layer 80. As can be seen from FIG. 6, the life of the semiconductor device 1 can be improved by covering the top wiring-electrode layer 58 with the passivation film.

According to the present embodiment, the thickness of the top wiring-electrode layer 58 is set greater than or equal to 0.3 μm, preferably, 0.7 μm, more preferably 1 μm. The thickness of the top wiring-electrode layer 58 is determined based on experimental results described below.

Figure 7:
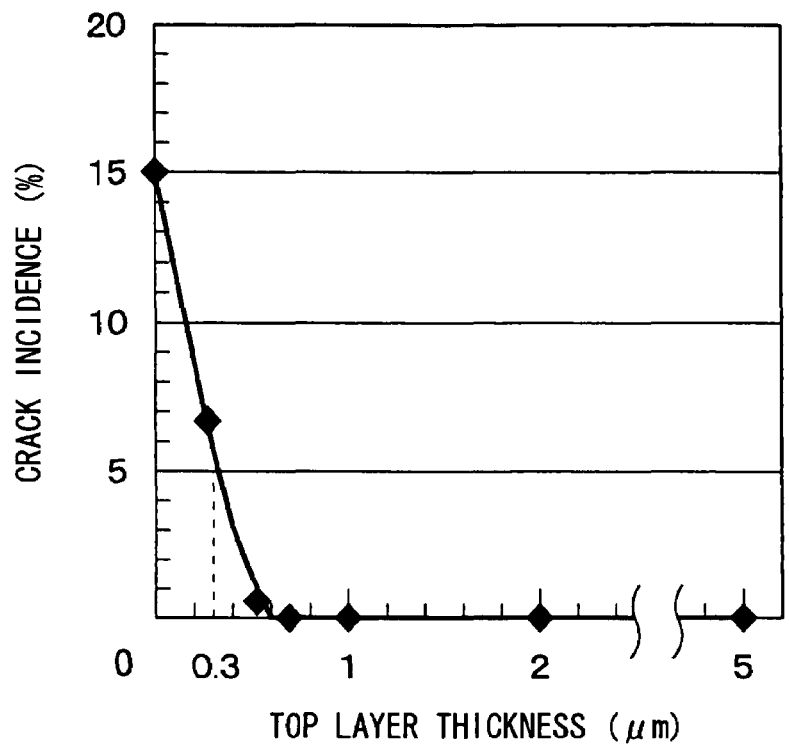
FIG. 7 is a diagram showing a graph of a relationship between an incidence of cracks in the semiconductor device and a thickness of a top wiring-electrode layer of the semiconductor device.

FIG. 7 shows a graph of an incidence of cracks in the semiconductor device 1, when the thickness of the top wiring-electrode layer 58 varies from 0 μm to 5 μm, the thickness of the third contact portion 59 is fixed to 1 μm, and the thickness of the bonding pad 62 is fixed to 1 μm. As can be seen from FIG. 7, as the thickness of the top wiring-electrode layer 58 becomes large, the deformation of the top wiring-electrode layer 58 becomes small so that the incidence of cracks can be reduced. When the thickness of the top wiring-electrode layer 58 is increased to 0.3 μm, the incidence of cracks is reduced below 0.5%. When the thickness of the top wiring-electrode layer 58 is increased above 0.7 μm, the incidence of cracks becomes 0%. When the thickness of the top wiring-electrode layer 58 is increased to 1 μm, the incidence of cracks surely becomes 0%. In the present embodiment, therefore, the thickness of the top wiring-electrode layer 58 is set greater than or equal to 0.3 µm, preferably, 0.7 µm, more preferably 1 µm.

The upper limit of the thickness of the top wiring-electrode layer 58 depends on some factors such as time pressure on coating processes of the top wiring-electrode layer 58. However, in view of the reduction in the incidence of cracks, there is no upper limit of the thickness of the top wiring-electrode layer 58. According to the experimental result, even when the thickness of the top wiring-electrode layer 58 is increased to 5 µm, the incidence of cracks surely becomes 0%.

When the third contact portion 59 positioned on the lower layer of the top wiring-electrode layer 58 is formed with material (e.g., copper, or copper alloy) having a large Young's Modulus value, the thickness of the contact portion 59 can be taken into account. In short, when the total thickness of the top wiring-electrode layer 58 and the contact portion 59 is set equal to or greater than 0.7 µm, the incidence of cracks is surely reduced to 0%. In the present embodiment, since the contact portion 59 (i.e., the copper layer 59*b*) is formed with copper, the thickness of the top wiring-electrode layer 58 can be reduced as compared to the case where the contact portion 59 is formed with material having a small Young's Modulus value.

According to the present embodiment, the thickness of the bonding pad 62 is set greater than or equal to 0.5 µm, preferably, 1 µm. The thickness of the bonding pad 62 is determined based on experimental results described below.

Figure 8:
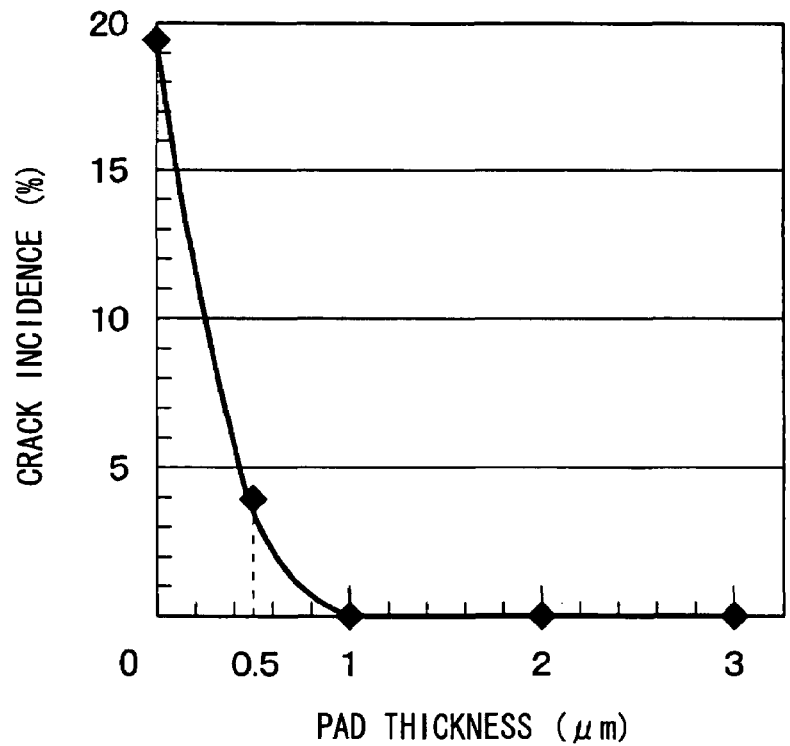
FIG. 8 is a diagram showing a graph of a relationship between the incidence of cracks and a thickness of the bonding pad.

FIG. 8 shows a graph of an incidence of cracks in the semiconductor device 1, when the thickness of the bonding pad 62 varies from 0 µm to 3 µm, the thickness of the top wiring-electrode layer 58 is fixed to 2 µm, and the thickness of the third contact portion 59 is fixed to 1 µm. As can be seen from FIG. 8, as the thickness of the top bonding pad 62 becomes large, the impact force absorbed by the bonding pad 62 is increased so that the incidence of cracks can be reduced. When the thickness of the bonding pad 62 is increased to 0.5 µm, the incidence of cracks is reduced below 0.5%. When the thickness of the bonding pad 62 is increased to 1 µm, the incidence of cracks becomes 0%. In the present embodiment, therefore, the thickness of the bonding pad 62 is set greater than or equal to 0.5 µm, preferably, 1 µm.

The upper limit of the thickness of the bonding pad 62 depends on some factors such as time pressure on coating processes of the bonding pad 62 and precision pressure on pattering processes of the bonding pad 62. However, in view of the reduction in the incidence of cracks, there is no upper limit of the thickness of the bonding pad 62. According to the experimental result, even when the thickness of the bonding pad 62 is increased to 3 µm, the incidence of cracks becomes 0%.

According to the present embodiment, as shown in FIGS. 1, 2, the width of the Cu layer 58*b* of the top wiring-electrode layer 58 is set so that the outer edge of the contact surface 71 between the bonding ball of the bonding wire 70 and the bonding pad 62 is separated from the outer edge of the Cu layer 58*b* by at least 1 µm in the lateral directions. The width of the Cu layer 58*b* is determined based on analysis results described below.

Figure 9A:
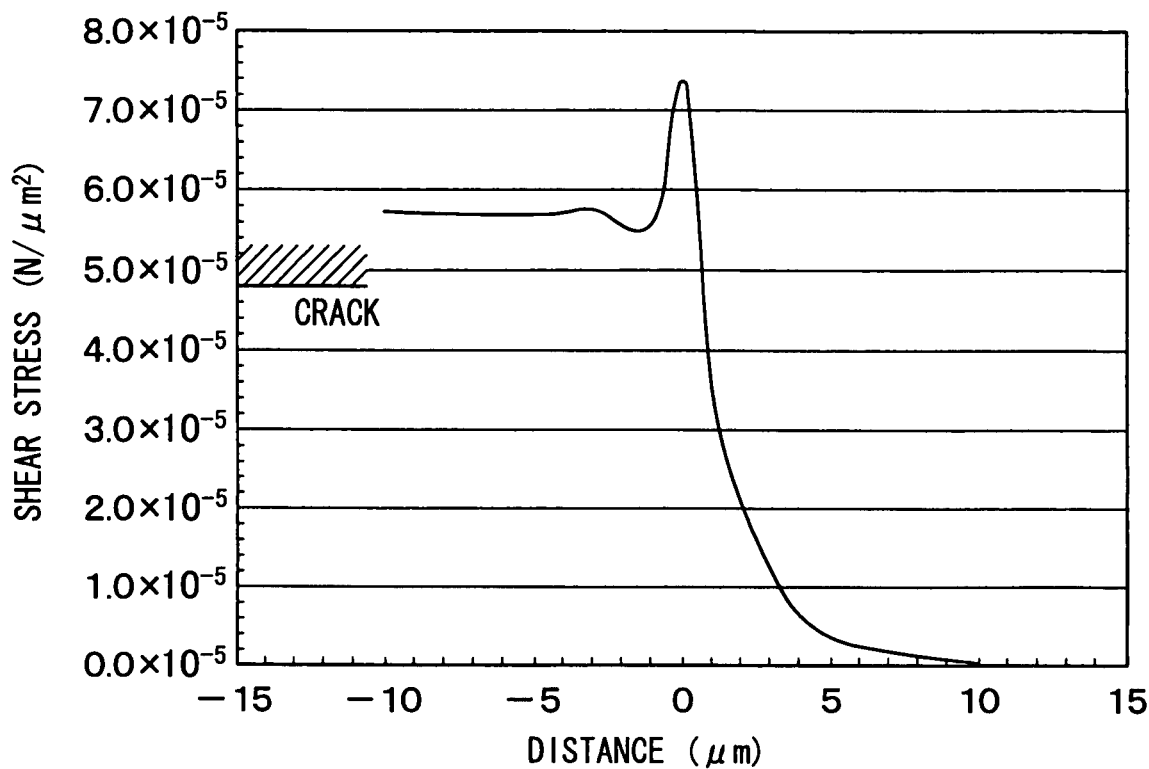
FIG. 9A is a diagram showing a graph of a relationship between a shear stress and a distance between outer edges of the top wiring-electrode layer and a contact surface between the bonding wire and the bonding pad.
Figure 9B:
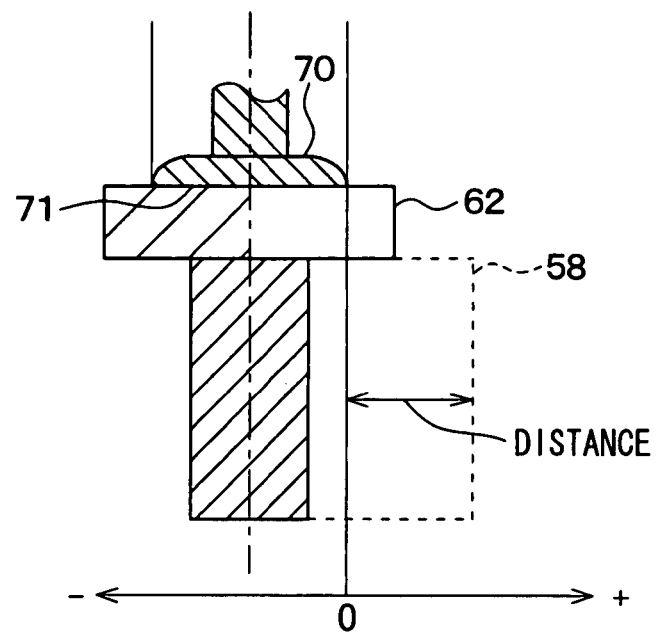
FIG. 9B is a cross-sectional view showing the distance between the outer edges of the top wiring-electrode layer and the contact surface.

FIG. 9A shows a simulation result of analysis of shear stress at the outer edge of the bonding ball of the bonding wire 70. In the shear stress analysis, as shown in FIG. 9B, the bonding pad 62 formed with aluminum (Al) is placed on the top wiring-electrode layer 58 formed with copper (Cu), and the bonding wire 70 formed with gold (Au) is placed on the bonding pad 62. The shear stress analysis is performed by changing the distance between the outer edge of the bonding ball of the bonding wire 70 and the outer edge of the top wiring-electrode layer 58 in the lateral direction.

As shown in FIG. 9A, the shear stress is maximum, when the distance is zero. As the distance increases, the shear stress decreases. Specifically, when the distance increases in the plus direction, the shear stress decreases ultimately to zero. In contrast, when the distance increases in the minus direction, the shear stress does not decrease below a certain value. For example, when it is assumed that cracks occurs at the shear stress greater than $4.8 \times 10^{-5}$ (N/µm$^2$), the shear stress can be reduced below $4.8 \times 10^{-5}$ (N/µm$^2$) by setting the distance greater than or equal to plus 1 µm. In the present embodiment, therefore, the width of the Cu layer 58*b* of the top wiring-electrode layer 58 is set so that the outer edge of the contact surface 71 between the bonding ball of the bonding wire 70 and the bonding pad 62 is separated from the outer edge of the Cu layer 58*b* by at least 1 µm in the lateral directions.

According to the present embodiment, the top wiring-electrode layer 58 is formed with material having a large Young's Modulus value greater than or equal to $1.0 \times 10^4$ kg/mm$^2$. The Young's Modulus value for the top wiring-electrode layer 58 is determined based on experimental results described below.

Figure 10:
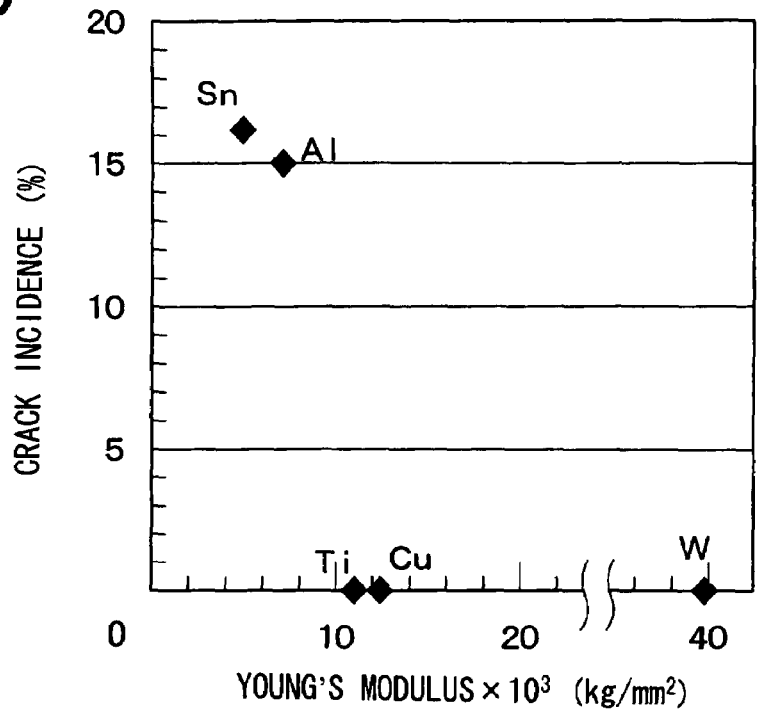
FIG. 10 is a diagram showing a graph of a relationship between the incidence of cracks and a Young's Modulus value of material of the top wiring-electrode layer.

FIG. 10 shows a graph of an incidence of cracks in the semiconductor device 1, when the thickness of the third contact portion 59 is fixed to 1 µm, the thickness of the bonding pad 62 is fixed to 1 µm, the thickness of the top wiring-electrode layer 58 is fixed to 2 µm, and the material of the top wiring-electrode layer 58 varies among tin (Sn), aluminum (Al), titanium (Ti), copper (Cu), and tungsten (W). As can be seen from FIG. 10, the incidence of cracks is high, when the top wiring-electrode layer 58 is formed with tin (Sn) or aluminum (Al), which has a small Young's Modulus value. In contrast, the incidence of cracks is approximately zero, when the top wiring-electrode layer 58 is formed with titanium (Ti), copper (Cu), or tungsten (W), which has a larger Young's Modulus value than that of each of tin (Sn) and aluminum (Al). Titanium (Ti) has a Young's Modulus value of $1.0 \times 10^4$ kg/mm$^2$, and the Young's Modulus value of titanium (Ti) is smaller than that of each of copper (Cu) and tungsten (W). In the present embodiment, therefore, the top wiring-electrode layer 58 is formed with material having a Young's Modulus value greater than or equal to $1.0 \times 10^4$ kg/mm$^2$.

According to the present embodiment, the bonding pad 62 is formed with material having a small Young's Modulus value less than or equal to $8.0 \times 10^3$ kg/mm$^2$. The Young's Modulus value for the bonding pad 62 is determined based on experimental results described below.

Figure 11:
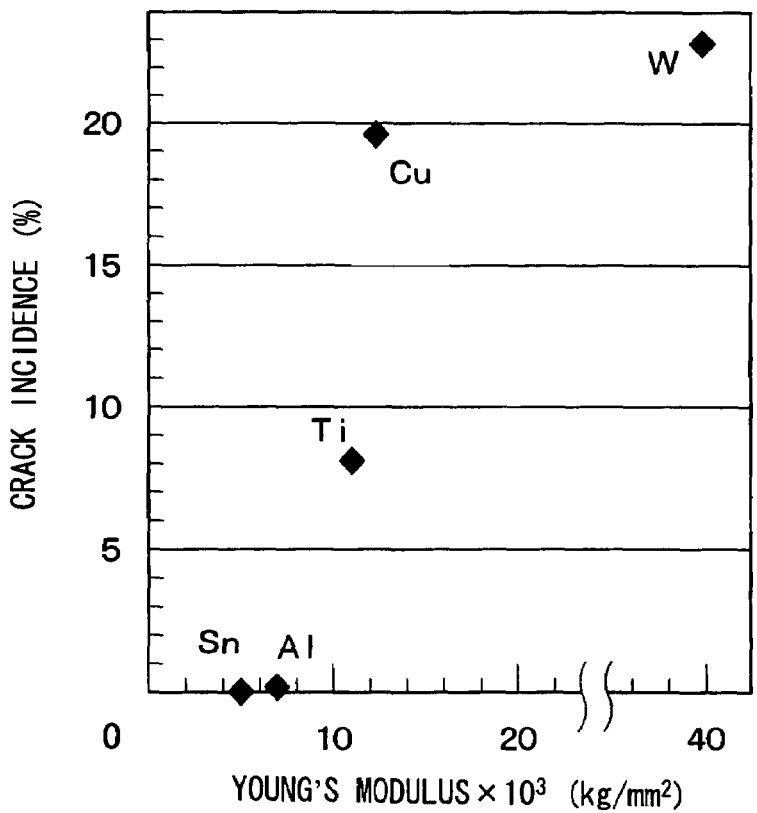
FIG. 11 is a diagram showing a graph of a relationship between the incidence of cracks and a Young's Modulus value of material of the bonding pad.

FIG. 11 shows a graph of an incidence of cracks in the semiconductor device 1, when the thickness of the third contact portion 59 is fixed to 1 µm, the thickness of the bonding pad 62 is fixed to 1 µm, the thickness of the top wiring-electrode layer 58 is fixed to 2 µm, and the material of the bonding pad 62 varies among tin (Sn), aluminum (Al), titanium (Ti), copper (Cu), and tungsten (W). As can be seen from FIG. 11, the incidence of cracks is high, when the bonding pad 62 is formed with titanium (Ti), copper (Cu), or tungsten (W), which has a larger Young's Modulus value. In contrast, the incidence of cracks is approximately zero, when the bonding pad 62 is formed with tin (Sn) or aluminum (Al), which has a small Young's Modulus value. Aluminum (Al) has a Young's Modulus value of $8.0 \times 10^3$ kg/mm$^2$, and the Young's Modulus value of aluminum (Al) is greater than that of tin (Sn). In the present embodiment, therefore, the bonding pad 62 is formed with material having a Young's Modulus value less than or equal to $8.0 \times 10^3$ kg/mm$^2$.

As can be seen from FIGS. 10, 11, the incidence of the cracks depends on the Young's Module value of the materials that form the top wiring-electrode layer 58 and the bonding pad 62. Therefore, the top wiring-electrode layer 58 and the bonding pad 62 can be formed with other materials than the materials shown in FIGS. 10, 11. For example, the top wiring-electrode layer 58 and the bonding pad 62 can be formed with materials shown in FIG. 12.

As described above, in the semiconductor device 1 according to the present embodiment, all side walls of the top wiring-electrode layer 58 are surrounded by the third insulation film 60 so that the top wiring-electrode layer 58 is buried and fixed in the third insulation film 60. Thus, the deformation of the top wiring-electrode layer 58 due to the impact force during the wire bonding can be reduced.

The top wiring-electrode layer 58 is formed with material having a Young's Modulus value greater than or equal to $1 \times 10^4$ kg/mm$^2$. The thickness of the top wiring-electrode layer 58 is set greater than or equal to 0.3 μm, preferably, 0.7 μm, more preferably 1 μm. In such an approach, the deformation of the top wiring-electrode layer 58 is suitably prevented so that cracks in the interlayer dielectric film and the elements positioned under the top wiring-electrode layer 58 can be prevented.

The bonding pad 62 is formed with material having a small Young's Modulus value less than or equal to $8.0 \times 10^3$ kg/mm$^2$. The thickness of the bonding pad 62 is set greater than or equal to 0.5 μm, preferably, 1 μm. In such an approach, the bonding pad 62 suitably absorbs the impact force during the wire bonding so that the cracks in the interlayer dielectric film and the elements can be prevented.

A method of manufacturing the semiconductor device 1 is described below. The LDMOS 10, the CMOS 20, and the bipolar transistor 30 are formed to the SOI substrate 2 in a conventional manner. The BSPG film 51, the first wiring layer 52, the first contact portion 53, the first insulation film 54, and the second contact portion 56 of the wiring structure 50 are formed in a conventional manner.

After the second contact portion 56 is formed, the first TEOS film 57a of the second insulation film 57 is formed such that the thickness of the first TEOS film 57a is approximately equal to the thickness of the second wiring layer 55, which is formed later. Then, the trench for the second wiring layer 55 is formed to the predetermined location of the first TEOS film 57a by a photo-etching process. Then, the barrier metal 55a and the Cu layer 55b are formed. Then, the second wiring layer 55 is disposed in the trench of the first TEOS film 57a by a CMP polishing process, where the first TEOS film 57a is used as a stopper layer. Then, the silicon nitride film 57b is formed to cover the surfaces of the first TEOS film 57a and the second wiring layer 55.

Then, the second TEOS film 57c is formed such that the thickness of the second TEOS film 57c is approximately equal to the thickness of the third contact portion 59, which is formed later. For example, the second TEOS film 57c is formed such that the thickness of the second TEOS film 57c is approximately 1 μm. Then, the trench for the third contact portion 59 is formed to the predetermined locations of the second TEOS film 57c and the silicon nitride film 57b by a photo-etching process. Then, the barrier metal 59a and the Cu layer 59b are formed. Then, the third contact portion 59 is disposed in the trench of the second TEOS film 57c and the silicon nitride film 57b by a CMP polishing process, where the second TEOS film 57c is used as a stopper layer.

Then, the third insulation film 60 is formed such that the thickness of the third insulation film 60 is approximately equal to the thickness of the top wiring-electrode layer 58, which is formed later. Specifically, the third insulation film 60 is formed such that the thickness of the top wiring-electrode layer 58 is greater than or equal to 0.5 μm, preferably 1 μm. Then, the trench for the top wiring-electrode layer 58 is formed to the predetermined location of the third insulation film 60 by a photo-etching process. Then, the barrier metal 58a and the Cu layer 58b, which has a large Young's Modulus value, are formed. Then, the top wiring-electrode layer 58 is disposed in the trench of the third insulation film 60 by a CMP polishing process, where the third insulation film 60 is used as a stopper layer. Thus, the top wiring-electrode layer 58 has a large thickness, and all the sidewalls of the top wiring-electrode layer 58 are surrounded by the third insulation film 60. Further, as a result of the CMP polishing process, the top surface of the top wiring-electrode layer 58 becomes flat with respect to the top surface of the third insulation film 60.

Then, after the P—SiN film 61 is formed, the opening for the bonding pad 62 is formed to the predetermined location of the P—SiN film 61. Then, a metal material having a small Young's Modulus value is formed and shaped into the bonding pad 62 by a patterning process. Then, the bonding wire 70 is wire-bonded to the bonding pad 62. Thus, the semiconductor device according to the present embodiment is manufactured.

Second Embodiment

Figure 13:
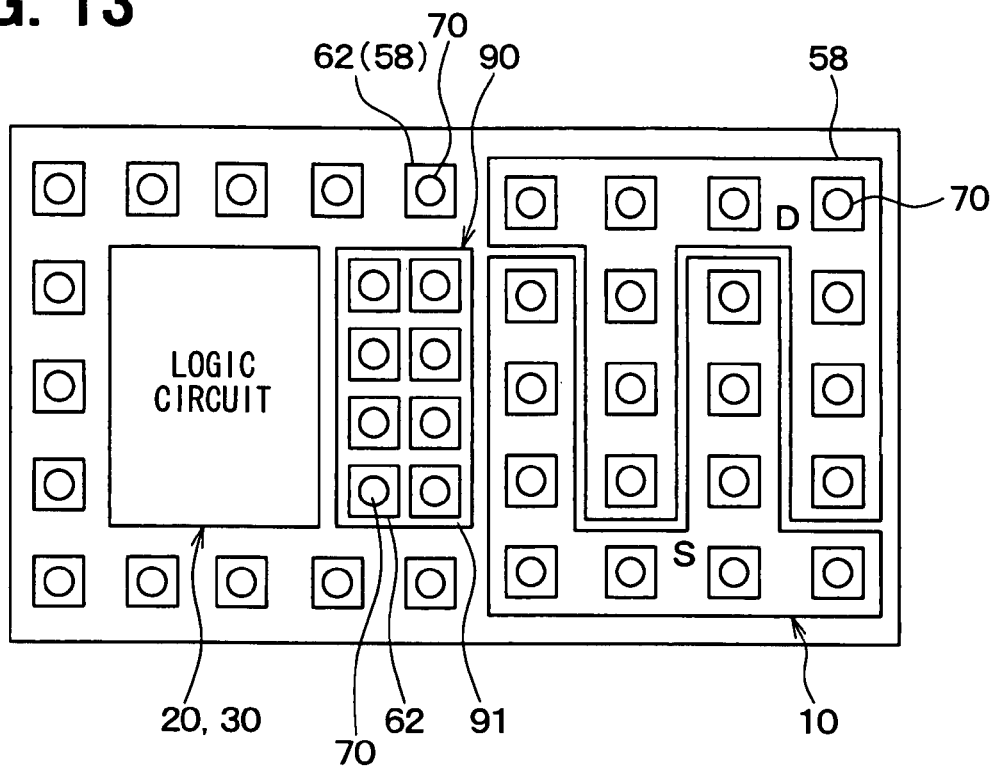
FIG. 13 is a top view showing a layout of a top wiring-electrode layer of a semiconductor device according to a second embodiment of the present invention.

A second embodiment of the second embodiment is described below with reference to FIG. 13. As shown in FIG. 13, the second embodiment refers to a case where free space 90 exists on a layer where the top wiring-electrode layer 58 is formed. The free space 90 is a region other than regions in which the LDMOS 10, a logic circuit constructed with the CMOS 20 and the bipolar transistor 30, and the bonding pad 62 for electrically connecting each portion of the logic circuit are formed.

A dummy pattern 91 of the top wiring-electrode layer 58 is formed to the free space 90, and a bonding pad 62 is formed on the dummy pattern 91 so that a bonding wire 70 is connectable to the top wiring-electrode layer 58 through the bonding pad 62. As long as the number of pins of a package accommodating the semiconductor device 1 is allowed, the pins and the dummy pattern 91 are connected through the bonding wire 70.

According to the second embodiment, the dummy pattern 91 of the top wiring-electrode layer 58 is formed to the free space 90. In such an approach, heat capacity and heat dissipation area can be increased so that heat can be efficiently released. Further, when the dummy pattern 91 is connected to the bonding wire 70, the heat is also released through the bonding wire 70. Thus, heat release efficiency is increased. Furthermore, the top wiring-electrode layer 58 can be easily and accurately planarized by forming the dummy pattern 91 of the top wiring-electrode layer 58 to the free space 90.

(Modifications)

The first and second embodiments described above may be modified in various ways. In the embodiments described above, the semiconductor device 1 is formed by using the SOI substrate 2. In the SOI substrate 2, the insulation film 9 reduces thermal conductivity. The top wiring-electrode layer 58 compensates the reduction the thermal conductivity. Alternatively, the semiconductor device 1 may be formed by using an other substrate such as a single silicon substrate.

In the embodiments described above, the semiconductor device 1 includes the LDMOS 10, the CMOS 20, and the bipolar transistor 30. Alternatively, the semiconductor device 1 may include a power element that consumes a large current (e.g., at least 10 amperes).

The semiconductor device 1 may include a passive element thereon, in addition to or instead of the LDMOS 10, the CMOS 20, and the bipolar transistor 30, which are formed in the semiconductor device 1.

In the embodiments described above, the third contact portion 59 is formed with material having a large Young's Modulus value as well as the top wiring-electrode layer 58. Alternatively, the third contact portion 59 may be formed with material having a small Young's Modulus value as well as the bonding pad 62.

In the embodiments described above, the top wiring-electrode layer 58 is formed with material having a large Young's Modulus value. Alternatively, side walls (e.g., the barrier metal 58a) of the top wiring-electrode layer 58 may be formed with material having a small Young's Modulus value.

In the embodiments described above, the bonding pad 62 is electrically connected to the bonding wire 70 so that the semiconductor device 1 can be electrically connected to the external device through the bonding wire 70. Alternatively, the bonding pad 62 may be electrically connected to a metal bump.

Figure 14A:
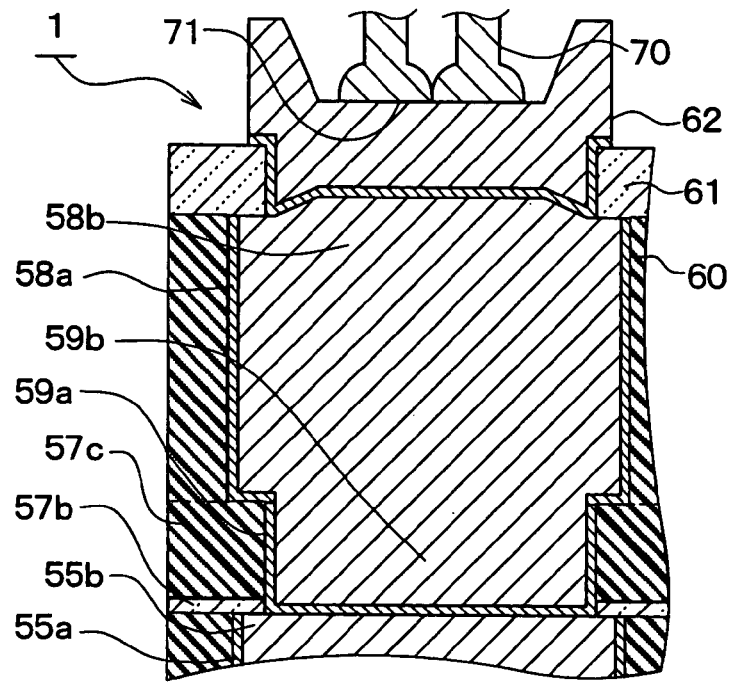
FIG. 14A is a cross-sectional view showing a bonding portion of a semiconductor device according to a modification.
Figure 14B:
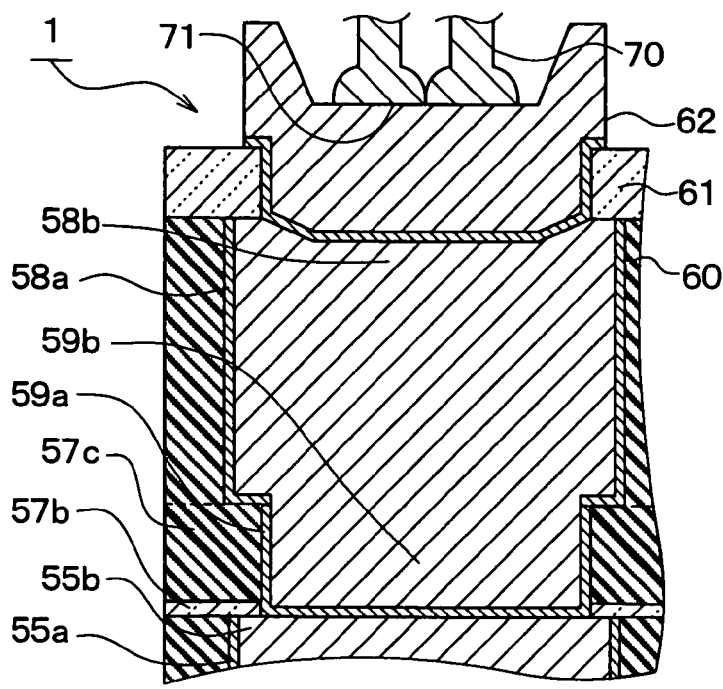
FIG. 14B is a cross-sectional view showing a bonding portion of a semiconductor device according to another modification.

In the embodiments described above, the top surface of the top wiring-electrode layer 58 is substantially flat with respect to the top surface of the third insulation film 60. The meaning of the "substantially flat" includes the case where the top surface of the top wiring-electrode layer 58 is slightly recessed or project from the third insulation film 60, as shown in FIGS. 14A, 14B.

Figure 15:
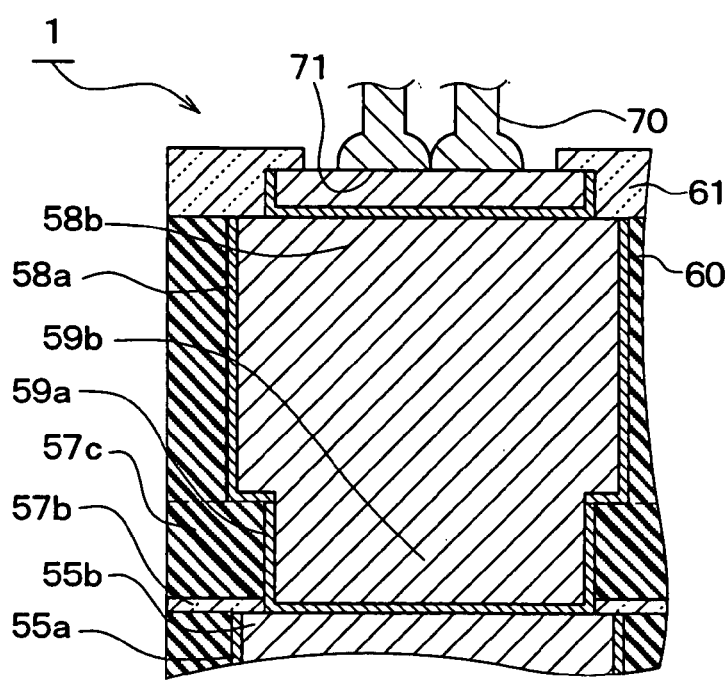
FIG. 15 is a cross-sectional view showing a bonding portion of a semiconductor device according to another modification.

In the embodiments described above, the bonding pad 62 is formed after the P—Sin film 61 as the passivation film is formed, and the bonding pad 62 is partially positioned on a layer upper than that of the P—Sin film 61. Alternatively, the bonding pad 62 may be formed before the P—Sin film 61 is formed. When the bonding pad 62 is formed before the P—Sin film 61, an outer edge of the bonding pad 62 can be covered by the P—Sin film 61, as shown in FIG. 15. As described previously, the bonding pad 62 is formed with material having a small Young's Modulus value and can be plastically deformed by the bonding impact force. By covering the bonding pad 62 with the P—Sin film 61, lateral motion of the bonding pad 62 due to the bonding impact force can be prevented by the P—Sin film 61.

Third Embodiment

A third embodiment of the present invention is described below with reference to FIGS. 16A-18. The third embodiment refers to a method of forming a wiring layer having a large thickness. For example, the wiring forming method according to the third embodiment can be applied to form the top wiring-electrode layer 58 of the semiconductor device 1.

(First Interlayer Dielectric Film Forming Process)

Figure 16A:
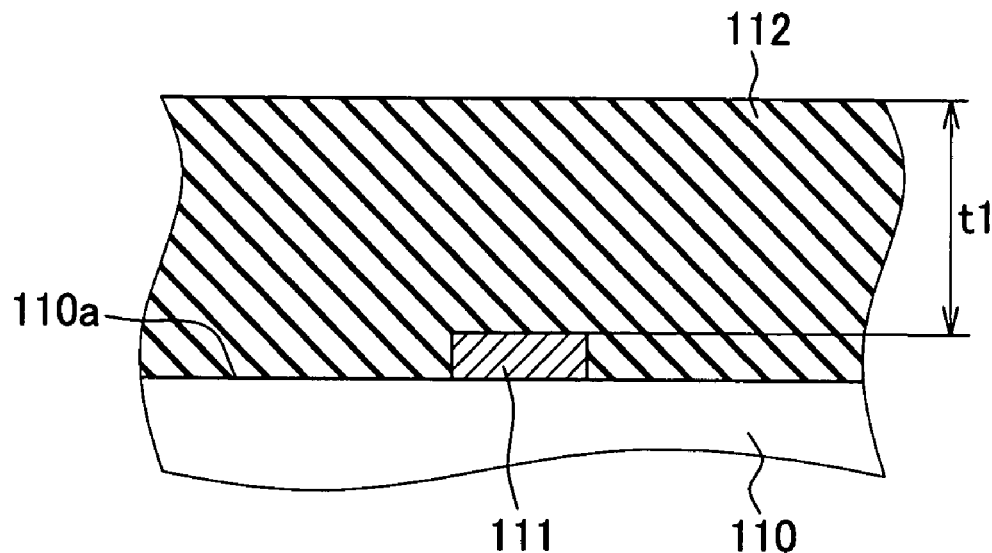
FIG. 16A is a cross-sectional view showing a first interlayer dielectric film forming process of a wiring forming method according to a third embodiment of the present invention.

First, a substrate 110 is prepared. As shown in FIG. 16A, a lower wiring layer 111 is formed on a surface 110a of the substrate 110 in advance. The substrate 110 is a silicon substrate, a SOI substrate, or the like. The lower wiring layer 111 is formed with copper (Cu), aluminum (Al), molybdenum (Mo), or the like. The lower wiring layer 111 may be provided with a barrier layer (not shown) for diffusion prevention.

Then, a first interlayer dielectric film 112 is formed on the surface 110a of the substrate 110. The first interlayer dielectric film 112 has a first thickness t1 enough to form a via trench 113 and a wiring trench 115 therein. It is preferable that the first interlayer dielectric film 112 be a low-k film to reduce crosstalk. In the present embodiment, the first interlayer dielectric film 112 is a silicon oxide (SIO2) film with a first thickness t1 of 3.5 μm and formed by a chemical vapor deposition (CVD) process. Alternatively, the first interlayer dielectric film 112 may be a low-k film such as a SiOC film, a FSG film, a PSG film, a BPSG film, a SOG film, or the like.

(Via Trench Forming Process)

Then, a photoresist is deposited on a surface of the first interlayer dielectric film 112. Then, a first resist pattern corresponding to the via trench 113 for connecting the lower wiring layer 111 and an upper wiring layer 119 is formed by a photolithography process.

Figure 16B:
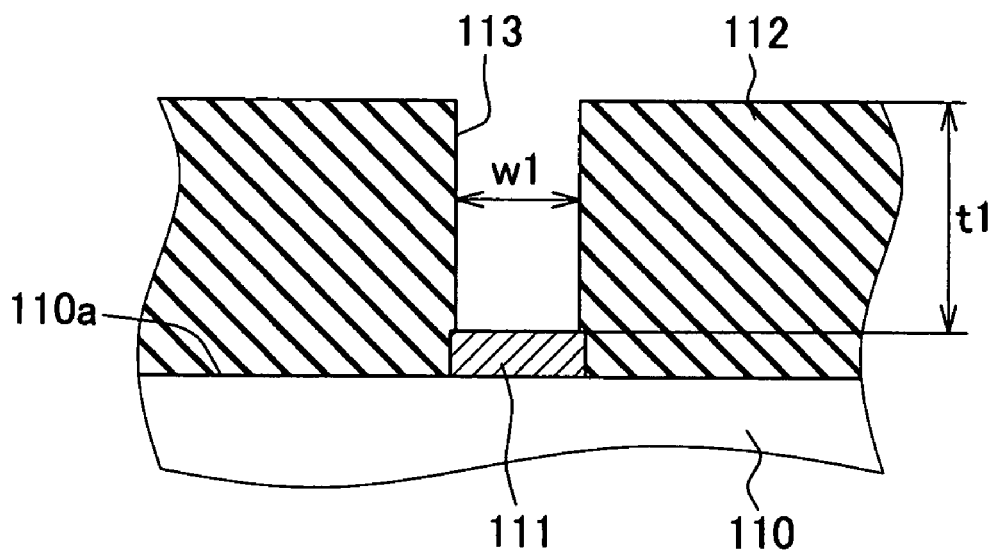
FIG. 16B is a cross-sectional view showing a via trench forming process of the wiring forming method.

Then, as shown in FIG. 16B, a first anisotropic etching process is applied to the first interlayer dielectric film 112 in the thickness direction by using the first resist pattern as a mask. Thus, the via trench 113 with a width w1 (e.g., 1 μm) is formed. For example, the first anisotropic etching is performed by adjusting conditions such as gas composition, pressure, and outputs in a dry etching process. An amount of etching in the first anisotropic etching process is set to the first thickness t1 so that the via trench 113 reaches the lower wiring layer 111. In this case, the lower wiring layer 111 may be used as an etching stopper layer. Thus, the via trench 113 has an uniform depth equal to the first thickness t1 of the first interlayer dielectric film 112, and a bottom of the via trench 113 becomes flat. After the via trench 113 is formed, the first resist pattern is removed by a conventional process.

(Second Interlayer Dielectric Film Forming Process)

Figure 17A:
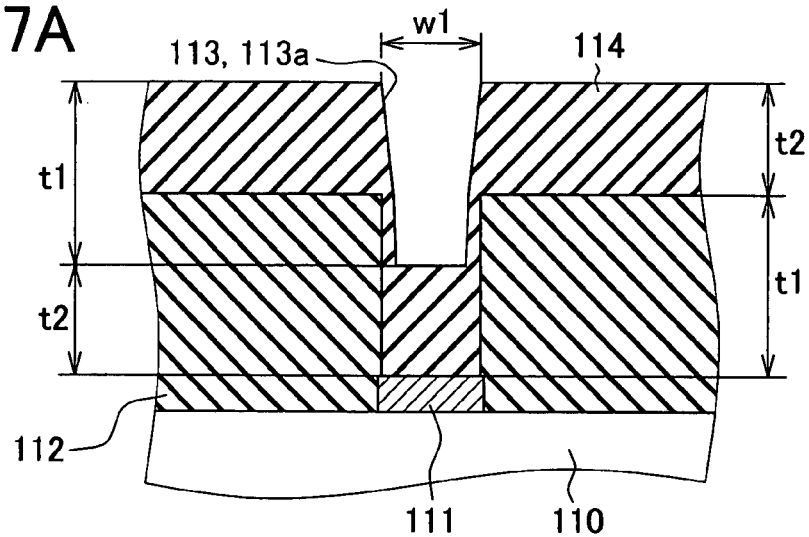
FIG. 17A is a cross-sectional view showing a second interlayer dielectric film forming process of the wiring forming method.

Then, as shown in FIG. 17A, a second interlayer dielectric film 114 is formed on the first interlayer dielectric film 112, where the via trench 113 is formed. A second thickness t2 of the second interlayer dielectric film 114 is set equal to or less than the first thickness t1 of the first interlayer dielectric film 112. For example, the second interlayer dielectric film 114 is a silicon oxide (SIO2) film and has the second thickness t2 of 2.5 μm. The first and second interlayer dielectric films 112, 114 may be formed with different materials.

The second interlayer dielectric film 114 is deposited also on the bottom of the via trench 113 to a depth equal to the second thickness t2. As a result, the via trench 113 rises in the depth direction by a distance equal to the second thickness t2 of the second interlayer dielectric film 114. The second interlayer dielectric film 114 is deposited also on an inner surface of the via trench 113. As a result, a slope portion 113a is formed on the inner surface of the via trench 113 so that the via trench 113 narrows toward the bottom.

In the present embodiment, since the first an second interlayer dielectric films are formed separately, an aspect ratio of the via trench 113 can be small. Thus, although the via trench 113 has a narrow width, the via trench 113 can easily reach the lower wiring layer 111.

(Wiring Trench Forming Process)

Then, a photoresist is deposited on a surface of the second interlayer dielectric film 114. Then, a second resist pattern corresponding to the wiring trench 115 for the upper wiring layer 119 is formed by a photolithography process. The second resist pattern is shaped corresponding to the first resist pattern, and a width of the second resist pattern is set greater than that of the first resist pattern.

Figure 17B:
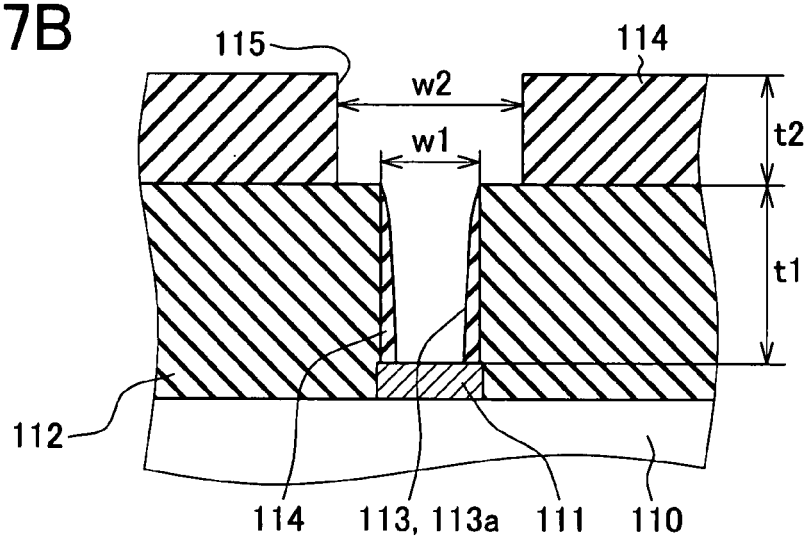
FIGS. 17B, 17C are cross-sectional views showing a wiring trench forming process of the wiring forming method.

Then, as shown in FIG. 17B, a second anisotropic etching is applied to the second interlayer dielectric film 114 in the thickness direction by using the second resist pattern as a mask. Thus, the wiring trench 115 with a width w2 (e.g., 1.5 μm) is formed. For example, the second anisotropic etching is performed by adjusting conditions such as gas composition, pressure, and outputs in a dry etching process. An amount of etching in the second anisotropic etching process is set to a third thickness t3 greater than the second thickness t2. For example, the third thickness t3 is 5 μm.

In the early stage of the second anisotropic etching, the wiring trench 115 is formed in accordance with the second resist pattern. Therefore, while maintaining its shape, the via trench 113 falls in the depth direction.

Figure 17C:
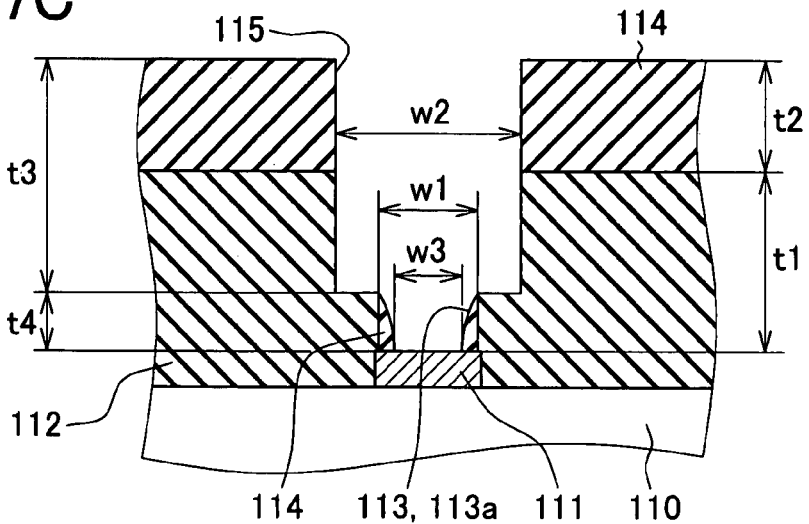
Figure 18:
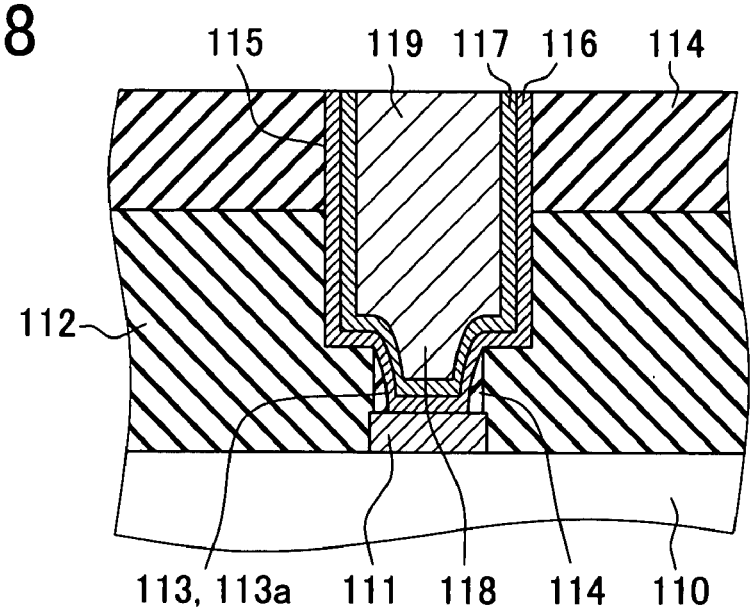
FIG. 18 is a cross-sectional view showing a wiring forming process of the wiring forming method.

Then, when the bottom of the via trench 113 reaches the lower wiring layer 111, the lower wiring layer 111 acts as an etching stopper layer. Therefore, as the second anisotropic etching process proceeds, a depth of the wiring trench 115 increases. Also, as the depth of the wiring trench 115 increases, a depth of the via trench 113 decreases. As shown in FIG. 17C, the second anisotropic etching process is finished when the depth of the via trench 113 becomes equal to a thickness t4.

Thus, the wiring trench 115 with the width of 1.5 μm and the depth of 5 μm is formed to the first and second interlayer dielectric films 112, 114. The via trench 113 with the slope portion 113a is formed to the first interlayer dielectric film 112 in the center of the wiring trench 115. Because of the slope portion 113a, the via trench 113 narrows toward the bottom in such a manner that the via trench 113 has the top width w1 of 1 μm and a bottom width w3 of between 0.5 μm and 0.8 μm.

The bottom of the via trench 113 can surely reach the lower wiring layer 111 by setting the amount of etching in the second anisotropic etching process greater than the second thickness t2 of the second interlayer dielectric film 114. Further, in such an approach, the via trench 113 can have an uniform depth equal to the thickness t4.

After the wiring trench 115 is formed, the second resist pattern is removed by a conventional process.

(Wiring Forming Process)

Then, wiring is formed by filling the via trench 113 and the wiring trench 115 with a conductive wiring material such as copper (Cu).

First, the barrier layer 116 is formed on inner walls of the via trench 113 and the wiring trench 115. The barrier layer 116 prevents the wiring material from diffusing into the first and second interlayer dielectric films 112, 114. For example, the barrier layer 116 is a tantalum nitride (TaN) layer or a titanium nitride (TiN) layer formed by a PVD process or a CVD process.

Then, a seed layer 117 is formed on a surface of the barrier layer 116. The seed layer 117 acts as an electrode when the wiring material is filled. The seed layer 117 is formed, for example, by copper sputtering.

Then, the via trench 113 and the wiring trench 115 are filled with the wiring material by electrolytic plating. After filling, the excess wiring material outside the trenches 113, 115 is removed by a CMP process so that the upper wiring layer 119 can be planarized. Alternatively, the upper wiring layer 119 may be planarized by an other process such as an etching back process.

Since the via trench 113 has the slope portion 113a, the barrier layer 116 and the seed layer 117 can be easily formed to the via trench 113 as compared to when the via trench 113 has no slope portion. Therefore, the seed layer 117 is well formed so that it can be ensured that the via trench 113 is filled with the wiring material. The via 118 having a desired shape can be formed.

Thus, the upper wiring layer 119 with the width of 1.5 μm and the thickness of 5 μm is formed in the first and second interlayer dielectric films 112, 114. The via 118 with the top width of 1 μm and the bottom width of between 0.5 μm and 0.8 μm is formed in the first interlayer dielectric film 112.

In the present embodiment, the wiring material is copper (Cu). Alternatively, the wiring material may be aluminum (Al). In this case, the via trench 113 and the wring trench 15 are filled with the wiring material (i.e., aluminum) by a reflow process.

As described above, in the first interlayer dielectric film forming process, the first interlayer dielectric film 112 is formed on the surface 110a of the substrate 110. Then, in the via trench forming process, the via trench 113 is formed by anisotropically etching the first interlayer dielectric film 112 until the lower wiring layer 111 is exposed. Then, in the second interlayer dielectric film forming process, the second interlayer dielectric film 114 is formed on the first interlayer dielectric film 112 and the via trench 113. Then, in the wiring trench forming process, the via trench 113 and the wiring trench 115 are connected together by anisotropically etching the first and second interlayer dielectric films 112, 114. The second interlayer dielectric film forming process and the wiring trench forming process are repeated a certain number of times. Then, in the wiring forming process, the via trench 113 and the wiring trench 115 are filled with the wiring material so that the via 118 and the upper wiring layer 119 are formed.

The via trench forming process ensures that the via trench 113 has the thickness equal to the thickness of the first interlayer dielectric film 112. Therefore, the via trench 113 can surely reach the lower wiring layer 13 by setting the etching amount in the wiring trench forming process greater than the thickness of the second interlayer dielectric film 114.

In such an approach, the via 118 can have a desired thickness (i.e., depth) without over-etching. Therefore, the thickness of the first interlayer dielectric film 112 between the lower and upper wiring layers 111, 119 can be maintained enough to prevent a short-circuit due to an increase in a leak current.

According to the present embodiment, the via 118 can have a desired thickness, and the upper wiring layer 119 having a large thickness can be well formed.

In the second interlayer dielectric film forming process, the thickness of the second interlayer dielectric film 114 is set to less than or equal to the thickness of the first interlayer dielectric film 112. Therefore, the etching amount required to connect the via trench 113 and the wiring trench 115 can be reduced so that the thickness of the via trench 113 can be uniform.

In the wiring trench forming process, the first and second interlayer dielectric films 112, 114 are etched to a depth greater than the thickness of the second interlayer dielectric film 114. In such an approach, the via trench 113 can surely reach the lower wiring layer 111.

The via trench 113 has the slope portion 113a so that the width of the via trench 113 narrows toward the lower wiring layer 111. In such an approach, the barrier layer 116 and the seed layer 117 can be formed up to the bottom of the via trench 113. Therefore, the via trench 113 can be surely filled with the wiring material so that the via 118 can have the same shape as the via trench 113.

(Modifications)

The third embodiment described above may be modified in various ways. In the third embodiment, in the via trench forming process, the lower wiring layer 111 is used as a stopper layer. Alternatively, an etching stopper layer may be formed in advance on the surface of the lower wiring layer 111. The etching stopper layer is formed with material having a large etching selectivity to the first interlayer dielectric film 112. For example, the etching stopper layer may be formed with silicon nitride (Si3N4) or silicon carbide (SiC). The etching stopper layer is removed by an etching process before the wiring forming process.

After the second interlayer dielectric film forming process and the wiring trench forming process are repeated a certain number of times, the wiring forming process is performed. In such an approach, the thickness of the upper wiring layer 119 can be increased.

Figure 19A:
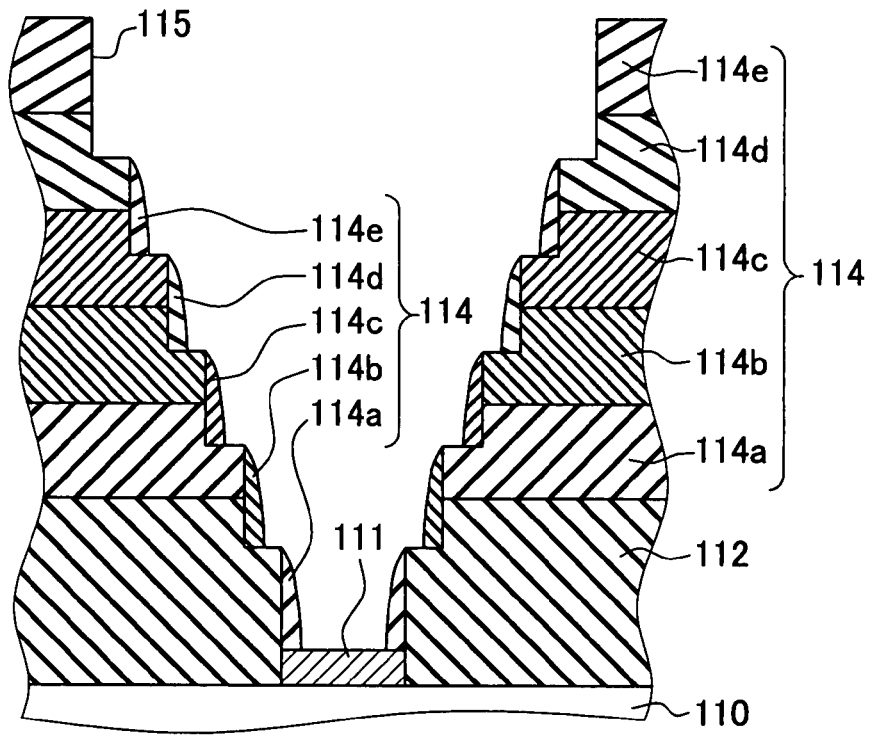
FIGS. 19A, 19B are cross-sectional views showing a wiring forming method according to a modification of the third embodiment.
Figure 19B:
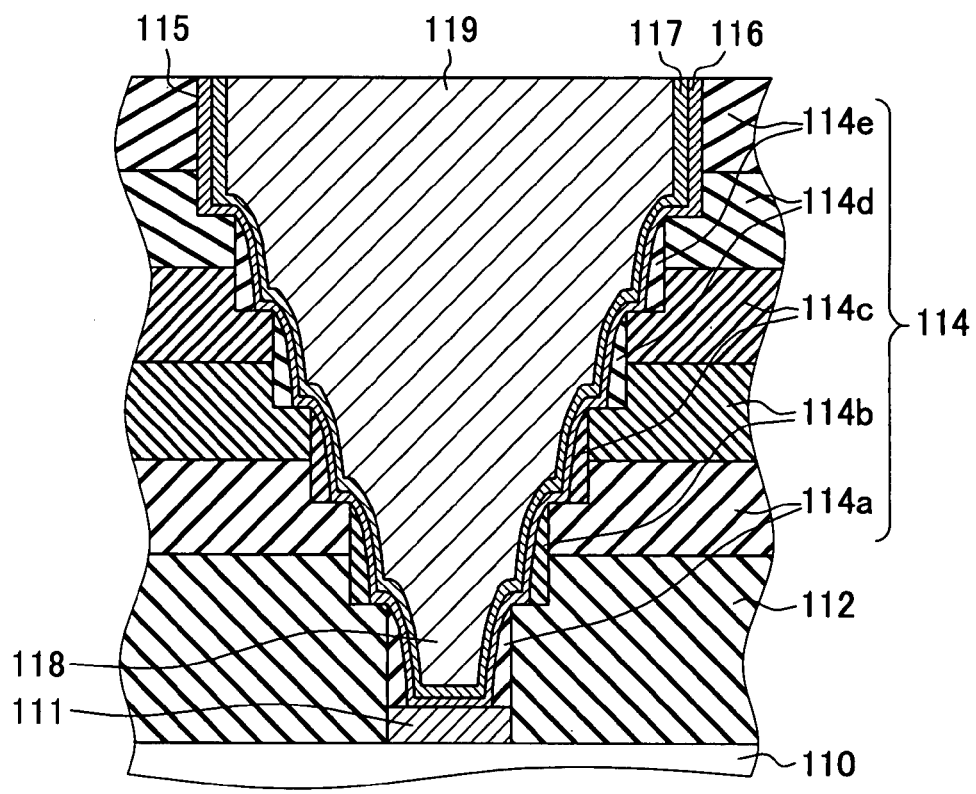
Figure 21A:
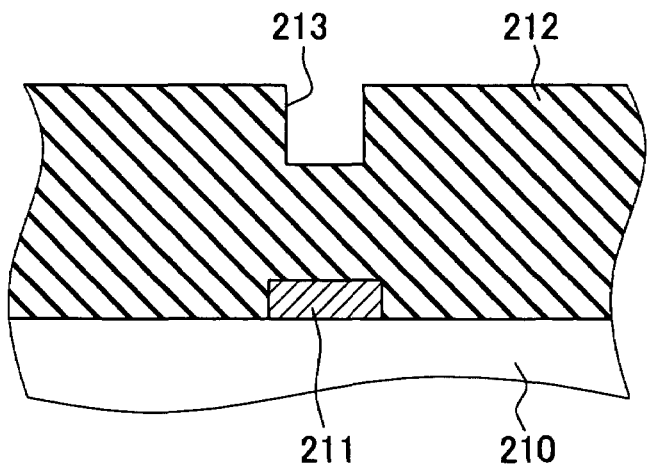
FIGS. 21A-21C are cross-sectional views showing a conventional wiring forming method.
Figure 21B:
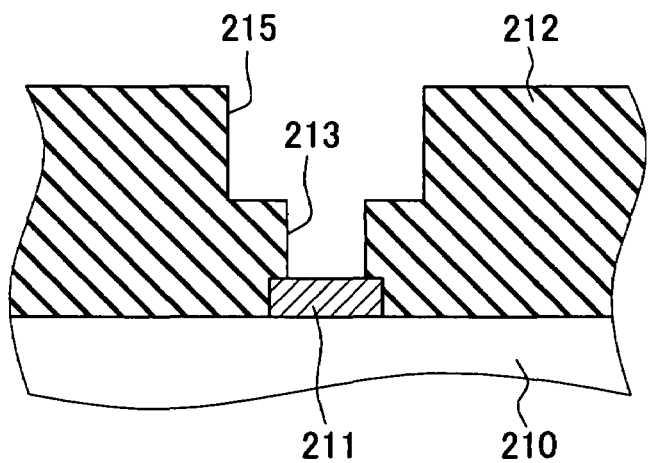
Figure 21C:
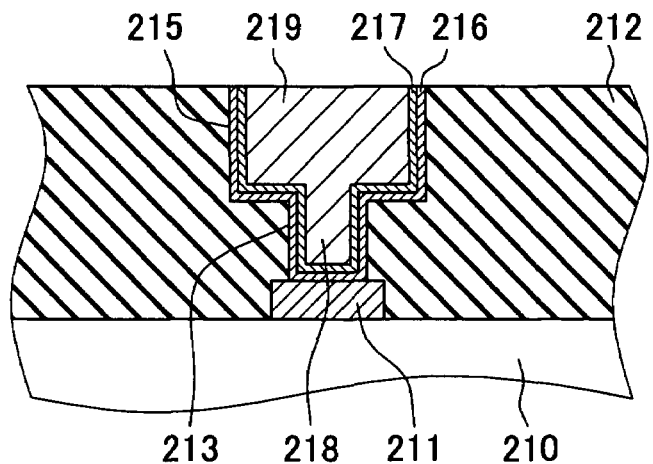

For example, as shown in FIGS. 19A, 19B, after a second interlayer dielectric film 114a on the lowest layer is formed, and the wiring trench 115 is formed once, second interlayer dielectric films 114b-114e are stacked one another. For example, each of the second interlayer dielectric films 114b-114e has a thickness of 2 µm. Each time one of the second interlayer dielectric films 114b-114e is stacked, the second interlayer dielectric film forming process and the wiring trench forming process are performed to form the wiring trench 115. In this case, the width of the wiring trench 115 narrows toward the lower wiring layer 111. Then, after the second interlayer dielectric film 114e on the top layer is stacked, the wiring forming process is performed. In the wiring forming process, the via trench 113 and the wiring trench 115 are filled with the wiring material. Thus, the via 118 and the upper wiring layer 119 are formed. In this case, the upper wiring layer 119 has a large thickness of 13 µm.

After the upper wiring layer 119 is formed, a new via and a new upper wiring layer are formed on the upper wiring layer 119 by performing a series of processes from the first interlayer dielectric film forming process to the wiring forming process. In such an approach, the thickness of the upper wiring layer 119 can be increased.

Figure 20:
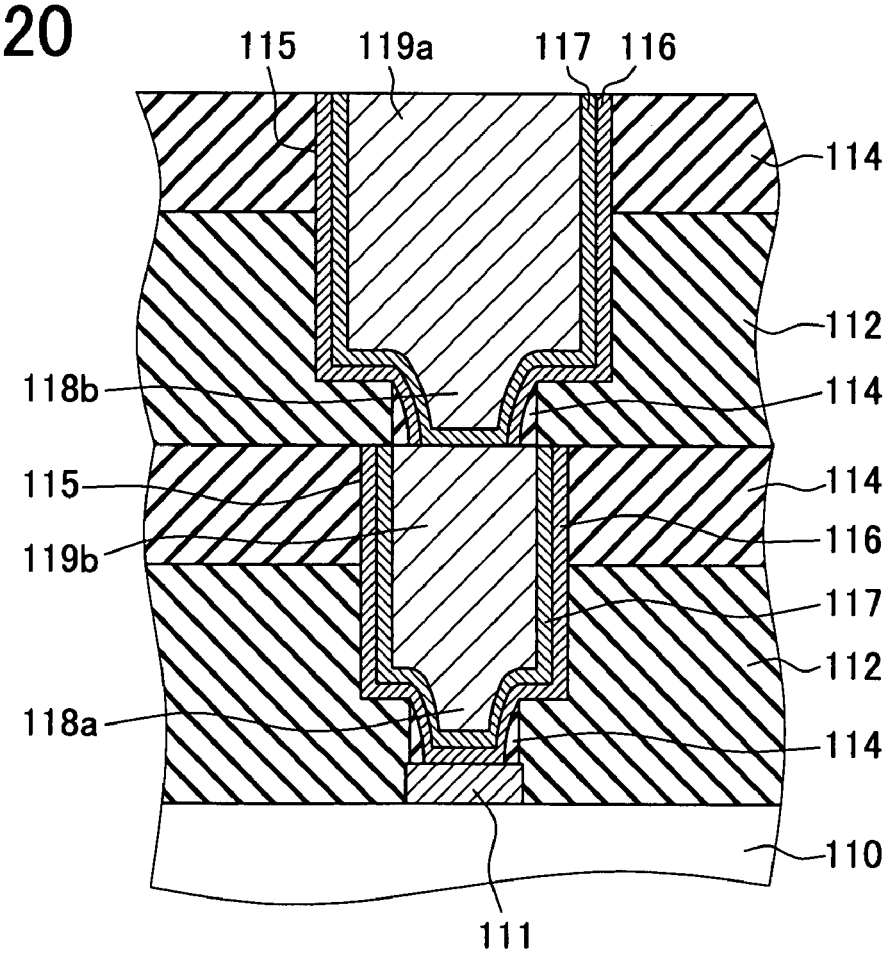
FIG. 20 is a cross-sectional view showing a wiring forming method according to another modification of the third embodiment.

For example, as shown in FIG. 20, after a via 118a and an upper wiring layer 119a are formed, a series of processes from the first interlayer dielectric film forming process to the wiring forming process is performed so that a new via 118b and a new upper wiring layer 119b are stacked in that order on the upper wiring layer 19a. Thus, the thickness of the upper wiring layer can be increased. As shown in FIG. 20, since the upper wiring layer 119a is wider than the lower wiring layer 111, the via 118b can be wider than the via 118a. Likewise, the upper wiring layer 119b can be wider than the upper wiring layer 119a.

Such changes and modifications are to be understood as being within the scope of the present invention as defined by the appended claims.

What is claimed is:

1. A semiconductor device comprising:
a semiconductor substrate;
a semiconductor element formed in the semiconductor substrate;
an interlayer dielectric film disposed on the semiconductor substrate;
a plurality of wiring layers that are separated from one another through the interlayer dielectric film and electrically coupled to the semiconductor element through the interlayer dielectric film;
a bonding pad electrically coupled to a top wiring layer of the plurality of wiring layers, the bonding pad being configured to be bonded to a metal bonding wire for electrically coupling the semiconductor element to an external device; and
a contact member disposed in a through hole in the interlayer dielectric film,
wherein the top wiring layer is configured to be a top wiring-electrode layer that doubles as an electrode layer disposed under the electrode pad,
wherein the top wiring-electrode layer is formed with a first material having a first Young's Modulus value,
wherein the bonding pad is formed with a second material having a second Young's Modulus value less than the first Young's Modulus value,
wherein the electrode layer of the top wiring-electrode layer is disposed directly above the semiconductor element,
wherein the bonding pad and the electrode layer are multilayered to form a pad structure,
wherein the interlayer dielectric film includes an insulation film that surrounds the top wiring-electrode layer to cover sidewalls of the top wiring-electrode layer,
wherein a thickness of the bonding pad is set, so that the bonding pad remains interposed between the bonding wire and the top wiring-electrode layer after the bonding wire is wire-bonded to the bonding pad,
wherein an outer edge of the top wiring-electrode layer is separated from an outer edge of a contact surface between the bonding wire and the bonding pad by at least 1 µm in a direction parallel to the contact surface, and
the contact member is positioned directly below the contact surface and couples the top wiring-electrode layer to a bottom wiring layer of the plurality of wiring layers.

2. The semiconductor device according to claim 1,
wherein the bonding wire is formed with a third material, and
wherein a first interdiffusion coefficient between the first material and the second material is less than a second interdiffusion coefficient between the second material and the third material.

3. The semiconductor device according to claim 1
wherein the first material is copper or copper alloy,
wherein the second material is aluminum or aluminum alloy, and
wherein the bonding wire is formed with gold.

4. The semiconductor device according to claim 1,
wherein the contact member is formed with a third material having a third Young's Modulus value greater than the second Young's Modulus value, and
wherein an outer edge of the contact member is separated from an outer edge of a contact surface between the bonding wire and the bonding pad by at least 1 µm in a direction parallel to the contact surface.

5. The semiconductor device according to claim 1,
wherein the contact member is formed with a third material having a third Young's Modulus value greater than the second Young's Modulus value, and
wherein a thickness of the top wiring-electrode layer is equal to or greater than 0.3 µm.

6. The semiconductor device according to claim 5,
wherein the total thickness of the top wiring-electrode layer and the contact member is equal to or greater than 0.7 µm.

7. The semiconductor device according to claim 1,
wherein a thickness of the top wiring-electrode layer is equal to or greater than 0.5 µm.

8. The semiconductor device according to claim 7,
wherein the thickness of the top wiring-electrode layer is equal to or greater than 1 µm.

9. The semiconductor device according to claim 1, further comprising:
a passivation film that covers a top surface of the top wiring-electrode layer and has an opening where the bonding pad is exposed.

10. The semiconductor device according to claim 1, further comprising:

a passivation film that covers a top surface of the top wiring-electrode layer and a perimeter portion of the bonding pad.

11. The semiconductor device according to claim 9, wherein the passivation film is deposited using chemical vapor deposition.

12. The semiconductor device according to claim 1, wherein a top surface of the wiring-electrode aver is flat with respect to a top surface of the insulation film.

13. The semiconductor device according to claim 1, wherein the semiconductor element includes a power element and a logic circuit, and
wherein the top wiring-electrode layer is electrically coupled to each of the power element and the logic circuit.

14. The semiconductor device according to claim 1, wherein the semiconductor substrate is configured as a silicon on insulator substrate, the silicon on insulator substrate having a supporting substrate, an active layer disposed on the supporting substrate, and an oxide film interposed between the supporting substrate and the active layer, and
wherein the semiconductor element is passively isolated by a trench that is formed in the active layer and filled with an insulation member.

15. The semiconductor device according to claim 1, wherein free space exists at a region other than regions in which the semiconductor region and the bonding pad are formed on a layer where the top wiring-electrode layer is formed, and
wherein a dummy pattern formed with the first material is formed in the free space.

16. The semiconductor device according to claim 15, wherein the bonding pad is connected to the dummy pattern, and
wherein the dummy pattern is connected to the bonding wire through the bonding pad.

17. The semiconductor device according to claim 1, wherein the bonding pad is plastically deformed by a bonding force, which is applied to the bonding pad when the bonding wire is bonded to the bonding pad.

18. The semiconductor device according to claim 17, wherein the second Young's Modulus value of the second material is less than or equal to $8.0 \times 10^3$ kg/mm$^2$.

19. The semiconductor device according to claim 17, wherein a thickness of the bonding pad is greater than or equal to 0.5 μm.

20. The semiconductor device according to claim 17, wherein the top wiring-electrode layer is plastically undeformed by the bonding force.

21. The semiconductor device according to claim 19, wherein the first Young's Modulus value of the first material is greater than or equal to $1.0 \times 10^4$ kg/mm$^2$.

22. The semiconductor device according to claim 17, wherein the pad structure is disposed directly above the semiconductor element.

* * * * *